United States Patent
Wada et al.

(10) Patent No.: US 9,356,247 B2
(45) Date of Patent: May 31, 2016

(54) SEMICONDUCTOR DEVICE AND METHOD FOR MANUFACTURING THE SAME

(75) Inventors: Masaru Wada, Kanagawa (JP); Shinichiro Kondo, Tokyo (JP); Ryouichi Yasuda, Tokyo (JP)

(73) Assignee: Sony Corporation, Tokyo (JP)

( * ) Notice: Subject to any disclaimer, the term of this patent is extended or adjusted under 35 U.S.C. 154(b) by 107 days.

(21) Appl. No.: 12/614,070

(22) Filed: Nov. 6, 2009

(65) Prior Publication Data

US 2010/0051931 A1 Mar. 4, 2010

Related U.S. Application Data

(63) Continuation of application No. 10/493,556, filed as application No. PCT/JP03/08403 on Jul. 2, 2003, now Pat. No. 7,615,775.

(30) Foreign Application Priority Data

Jul. 2, 2002 (JP) ................................. 2002-193153
Jun. 27, 2003 (JP) ................................. 2003-184860

(51) Int. Cl.
*H01L 51/10* (2006.01)
*H01L 51/05* (2006.01)
(Continued)

(52) U.S. Cl.
CPC ............. *H01L 51/0566* (2013.01); *B82Y 10/00* (2013.01); *H01L 51/005* (2013.01);
(Continued)

(58) Field of Classification Search
CPC ............ H01L 51/0545; H01L 51/0036; H01L 51/0541; H01L 51/5012
USPC ............ 257/40, 359, 581, E51.005, E51.011, 257/E51.015
See application file for complete search history.

(56) References Cited

U.S. PATENT DOCUMENTS

| 5,294,820 A | 3/1994 | Gemma et al. |
| 5,677,545 A * | 10/1997 | Shi et al. ................. 257/40 |

(Continued)

FOREIGN PATENT DOCUMENTS

| EP | 0 865 078 | 9/1998 |
| EP | 0865078 A | 9/1998 |

(Continued)

OTHER PUBLICATIONS

Japanese Office Action issued on Dec. 22, 2009, for corresponding Japanese Patent Application 2003-184860.

(Continued)

*Primary Examiner* — Monica D Harrison
(74) *Attorney, Agent, or Firm* — K&L Gates LLP

(57) ABSTRACT

A semiconductor apparatus in which a conducting path formed from organic semiconductor molecules as a material has a novel structure and exhibits high mobility, and a manufacturing method for fabricating the same are provided. Fine particles that include a conductor or a semiconductor and organic semiconductor molecules, are alternately bonded through a functional group at both terminals of the organic semiconductor molecules to form a conducting path in a network form such that the conducting path in the fine particles and the conducting path in the organic semiconductor molecules are two-dimensionally or three-dimensionally linked together. This conducting path includes no intermolecular electron transfer, and the mobility is not restricted by the intermolecular electron transfer, and therefore the mobility of the conducting path along the main chain in the organic semiconductor molecules (in the direction of the axis of the molecule), for example, displays a high intramolecular mobility due to delocalized π electrons can be fully utilized.

21 Claims, 20 Drawing Sheets

(51) Int. Cl.
*B82Y 10/00* (2011.01)
*H01L 51/00* (2006.01)

(52) U.S. Cl.
CPC ......... *H01L51/0012* (2013.01); *H01L 51/0068* (2013.01); *H01L 51/0075* (2013.01); *H01L 51/0094* (2013.01); *H01L 51/0095* (2013.01); *H01L 51/0541* (2013.01); *H01L 51/0545* (2013.01); *H01L 51/0595* (2013.01); *Y10S 977/89* (2013.01); *Y10S 977/936* (2013.01); *Y10S 977/938* (2013.01)

(56) References Cited

U.S. PATENT DOCUMENTS

| | | | |
|---|---|---|---|
| 6,180,956 B1 * | 1/2001 | Chondroudis et al. | 257/40 |
| 6,339,227 B1 * | 1/2002 | Ellenbogen | 257/40 |
| 6,430,511 B1 * | 8/2002 | Tour et al. | 702/19 |
| 6,781,166 B2 | 8/2004 | Lieber et al. | |
| 6,888,665 B2 * | 5/2005 | Feldheim et al. | 359/328 |
| 7,057,206 B2 | 6/2006 | Halik et al. | |
| 7,226,966 B2 | 6/2007 | Kambe et al. | |
| 7,582,897 B2 | 9/2009 | Hirai et al. | |
| 7,615,776 B2 * | 11/2009 | Chaudhari | 257/40 |
| 2003/0112564 A1 | 6/2003 | Granstrom | |
| 2005/0104060 A1 | 5/2005 | Halik et al. | |
| 2005/0148179 A1 | 7/2005 | Hirai et al. | |
| 2006/0214252 A1 | 9/2006 | Hirai et al. | |

FOREIGN PATENT DOCUMENTS

| | | |
|---|---|---|
| EP | 1 022 560 | 7/2000 |
| EP | 1022560 A | 7/2000 |
| EP | 1 215 205 | 6/2002 |
| EP | 1215205 A | 6/2002 |
| JP | 54-018852 | 2/1979 |
| JP | 64-089368 | 4/1989 |
| JP | 06-273811 | 9/1994 |
| JP | 2000-26099 | 9/2000 |
| JP | 2000-349275 | 12/2000 |
| JP | 2001-510922 | 8/2001 |
| JP | 2001-350015 | 12/2001 |
| JP | 2002-025636 | 1/2002 |
| JP | 2004-006827 | 1/2004 |
| JP | 2005-531132 | 10/2005 |
| WO | 96/07487 | 3/1996 |
| WO | 96/07487 A | 3/1996 |
| WO | 01/84714 | 11/2001 |
| WO | 01/84714 A | 11/2001 |
| WO | 03/089515 | 10/2003 |
| WO | 03/089515 A1 | 10/2003 |

OTHER PUBLICATIONS

Ronald P. Andres et al., "Self-Assembly of a Two-Dimensional Superlattice of Molecularly Linked Metal Clusters," Science, vol. 273, pp. 1690-1693, 1996.
Toshihiko Sato et al., "Dithiol-Linked Gold Colloidal Particles Used for Fabricating Single Electron Transistors," Extended Abstracts of the 1997 International Conference on Solid State Devices and Materials, pp. 498-199, 1997.
Dimitrakopoulos et al., IBM J. Res. & Dev. (2001), 45, 11.
Schoen et al., Nature (2001), 413, 713.
Schoen et al., Appl. Phys. Lett. (2002), 80, 847.
Chang et al., "The Shape Transition of Gold Nanorods" Langmuir (1999), 15, 701-709.
Musick et al., Chem. Mater. (1997), 9, 1499.
Musick et al., Chem Mater. (2000), 12, 2869.
Brust et al., J. Chem. Soc., Chem. Commun., 801 (1994).
Leff et al., Langmuir 12, 4723 (1996).
Andres et al., J. Vac. Sci. Technol. A 14, 1178 (1996).
Chang et al., Langmuir 15, 701 (1999).
Hiroshi Yao et al., Chemistry Letters, 458 (2002).
Collet et al., Applied Physics Letters, vol. 76, pp. 1339-1341 (2000).
Matters et al., Optical Materials, vol. 12, pp. 189-197 (1997).
Gelinck et al., Applied Physics Letters, vol. 77, pp. 1487-1489 (2000).
Vullaume et al., Applied Physics Letters, vol. 69, pp. 1646-1648 (1996).
Sato T Et Al: "Dithiol-Linked Gold Colloidal Particles Used for Fabricating Singleelectron Transistors" Extended Abstracts of the International Conference on Solidstate Devices and Materials, Japan Society of Applied Physics, Tokyo, JA, Sep. 1, 1997, p. 498/499.
Andrews R P Et Al: "Self-Assembly of a Two-Dimensional Superlattice of Molecularly Linked Metal Clusters" Science, Washington, DC, vol. 273, Sep. 20, 1996, pp. 1690-1693.
European Search Report for Appl. No. EP 10 17 5410 dated Sep. 27, 2010, p. 1-6.
Japanese Office Action issued on Oct. 26, 2010, for corresponding Japanese Patent Appln. No. 2010-035621.
Japanese Office Action issued Jun. 4, 2013 in corresponding Japanese Application No. 2011177982.

* cited by examiner

Direction of electron flow

Step 1 Fig.3A
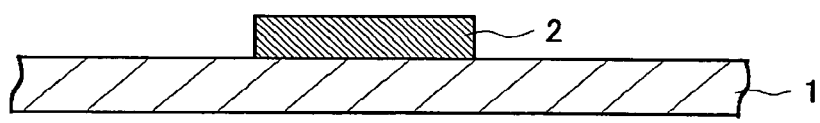
Step 2 Fig.3B
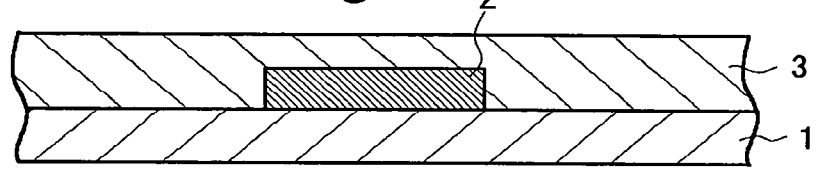
Step 3 Fig.3C
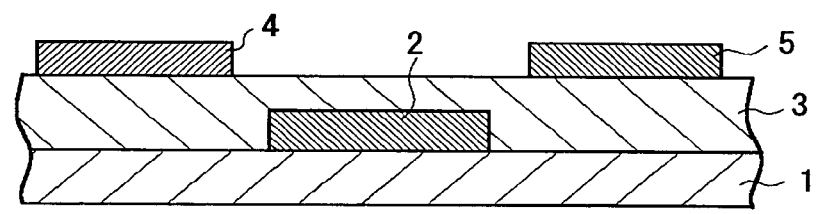
Step 4 Fig.3D
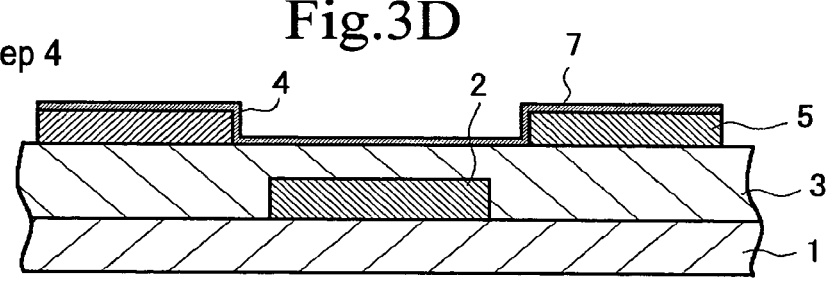
Step 5 Fig.3E
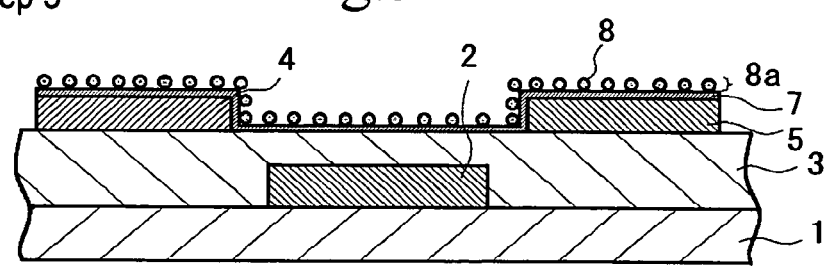

Step 6

Step 7

Step 8

Step 9

SEMICONDUCTOR DEVICE AND METHOD FOR MANUFACTURING THE SAME

CROSS REFERENCES TO RELATED APPLICATIONS

The present application is a continuation of U.S. patent application Ser. No. 10/493,556 filed on May 20, 2004 which is a National Stage of International Application No. PCT/JP2003/08403 filed on Jul. 2, 2003 which claims priority to Japanese Patent Document No. P2002-193153 filed on Jul. 2, 2002 and Japanese Patent Document No. P2003-184860 filed Jun. 27, 2003, the disclosure of which is herein incorporated by reference.

BACKGROUND

The present invention relates to a semiconductor apparatus which includes a conducting path formed from fine particles that include a conductor or a semiconductor and organic semiconductor molecules, and a manufacturing method for fabricating the same.

A thin film transistor (hereinafter, referred to simply as "TFT") is widely used as a switching element in an electronic circuit, especially in an active matrix circuit for use in display and the like.

Currently, most of TFTs are Si inorganic semiconductor transistors using amorphous silicon (a-Si) or polycrystalline silicon (Poly-Si) in a semiconductor layer (channel layer). In the fabrication of these transistors, plasma chemical vapor deposition (hereinafter, referred to simply as "CVD") or the like is used in formation of a semiconductor layer, and therefore the process cost is high. In addition, a heat treatment at a temperature as high as about 350° C. is required, and hence, not only the process cost is increased, but also the substrate is restricted.

In recent years, the development of organic semiconductor transistors using an organic semiconductor material is being vigorously made since such transistors can be fabricated by a low cost process and film deposition on a flexible substrate with low heat resistance, such as a plastic, is possible.

Organic semiconductor materials advantageously enable preparation of TFT at a lower temperature at a lower cost, e.g., by spin coating or dipping. However, they can achieve only a typical mobility value of $10^{-3}$ to 1 cm$^2$/Vs wherein the mobility is an index of the TFT properties. See, C. D. Dimitrakopoulos et al., Adv. Mater. (2002), 14, 99. This value is small, as compared to several cm$^2$/Vs which is the mobility of α-Si, or about 100 cm$^2$/Vs which is the mobility of Poly-Si, and does not reach a mobility of 1 to 3 cm$^2$/Vs required in the TFT for display. Therefore, the improvement of mobility is an important task of the development of organic semiconductor materials.

The mobility of the organic semiconductor material is determined by intramolecular charge transfer and intermolecular charge transfer.

The intramolecular charge transfer can be achieved by a conjugated system formed from delocalized electrons. The intermolecular charge transfer is made by conduction by overlapping of molecule orbital due to bonding between molecules, i.e., van der Waals force, or hopping conduction through an intermolecular trap level.

In this case, when the intramolecular mobility is taken as μ-intra, the mobility by bonding between molecules is taken as μ-inter, and the mobility of intermolecular hopping conduction is taken as μ-hop, the relationship: μ-intra>>μ-inter>μ-hop is satisfied. In the organic semiconductor material, slow intermolecular charge transfer limits the collective mobility, thus lowering the charge mobility.

For improving the mobility of the organic semiconductor, various studies have been made.

For example, in the formation of a pentacene thin film comprised of an organic semiconductor material by a vacuum vapor deposition process, the deposition rate in vapor deposition is considerably suppressed and the substrate temperature is lowered to room temperature to improve the orientation of the molecules, thus achieving a mobility of 0.6 cm$^2$/Vs. See, for example, C. D. Dimitrakopoulos et al., IBM J. Res. & Dev. (2001), 45, 11.

This improves the material in crystalline properties to suppress the intermolecular hopping conduction, improving the mobility. The mobility is improved, but the intermolecular transfer limits the collective mobility as well, and a satisfactorily large mobility cannot be obtained.

As an organic semiconductor transistor positively utilizing the intramolecular charge transfer, Lucent Technologies has proposed a self-assembled monolayer field-effect transistor (SAMFET). In this method, a semiconductor layer comprised of a self-assembled monomolecular film is formed between a source electrode and a drain electrode to realize an FET having a gate length of 1.5 nm.

In this method, the channel is formed from a monomolecular layer oriented in the direction of linking the source electrode and the drain electrode, and therefore charge transfer in the channel includes only intramolecular transfer, thus achieving a mobility of 290 cm$^2$/Vs, which is larger than that of Poly-Si. See, for example, J. H. Schoen et al., Nature (2001), 413, 713; and Appl. Phys. Lett. (2002), 80, 847.

However, in this channel structure, the gate length is determined by the thickness of the monomolecular film, and hence the gate length is as very small as several nm and therefore the source-drain withstand voltage is lowered, causing a problem that a high driving voltage cannot be obtained. In addition, for preventing the monomolecular film from being broken, it is necessary to cool the substrate to a temperature of −172 to −30° C. during the formation of electrodes on the monomolecular film, and therefore the process cost is increased, and this method is not practical.

Further, International Business Machines (IBM) has proposed a channel material using an organic/inorganic mixed material. See, for example, Unexamined Japanese Patent Application Laid-Open Specification No. 2000-260999. In this method, the inorganic component and the organic component form a layered structure, and, while utilizing the high carrier mobility properties of the inorganic crystalline solid, the action of the organic component to promote self-assembly of the inorganic material is utilized to enable the material to be deposited on a substrate under low temperature conditions for the treatment.

A mobility of 1 to 100 cm$^2$/Vs is expected, but the mobility actually achieved is only 0.25 cm$^2$/Vs. This is a mobility higher than that of the organic semiconductor generally formed by spin coating, but it is equivalent to the mobility of the organic semiconductor formed by vapor deposition or the like, and a mobility higher than that of a-Si has not yet been obtained.

SUMMARY

In view of the above, the present invention has been made to provide a semiconductor apparatus, in which a conducting path formed from organic semiconductor molecules has a novel structure and exhibits high mobility, and a manufacturing method for fabricating the same.

Specifically, the present invention is directed to a semiconductor apparatus which includes a conducting path formed from fine particles that include a conductor or a semiconductor and organic semiconductor molecules bonded to the fine particles, wherein the electrical conductivity of the conducting path is controlled by an electric field, and to a manufacturing method for fabricating the same according to an embodiment.

In the present invention, the fine particles are bonded by the organic semiconductor molecules to form the conducting path, and hence there may be formed the conducting path of a network type, in which a conducting path in the fine particles and a conducting path along the molecule skeleton in the organic semiconductor molecules are linked together.

Accordingly, a structure is obtained such that charge transfer occurs in the conducting path only in the direction of the axis of the molecule along the main chain of the organic semiconductor molecules. The conducting path includes no intermolecular electron transfer, and hence the mobility is not restricted by the intermolecular electron transfer which is the cause of low mobility of the conventional organic semiconductors.

Therefore, the charge transfer in the axis direction in the organic semiconductor molecules may be fully utilized. For example, when molecules having a conjugated system formed along the main chain are used as the organic semiconductor molecules, a high mobility due to delocalized $\pi$ electrons may be utilized.

Further, the channel region constituting the conducting path may be formed layer by layer through a low-temperature process at about 200° C. or lower under atmospheric pressure. Therefore, a channel layer having a desired thickness may be easily formed, and a semiconductor apparatus may be fabricated on a flexible substrate, such as a plastic substrate, at a low cost.

Additional features and advantages are described herein, and will be apparent from the following Detailed Description and the figures.

BRIEF DESCRIPTION OF THE FIGURES

FIGS. 3A to 3E are diagrammatic cross-sectional views showing the steps in the fabrication of a MOS field effect transistor according to an embodiment of the present invention.

DETAILED DESCRIPTION

Figure 1A:
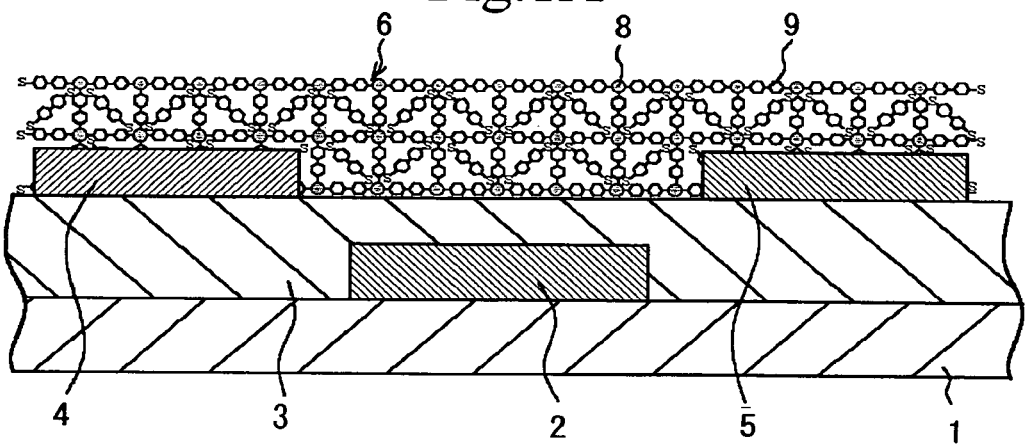
FIGS. 1A to 1C illustrate an example of the structure of a MOS field effect transistor according to an embodiment of the present invention, including a diagrammatic cross-sectional view (FIG. 1A), an enlarged view of the essential portion (FIG. 1B), and a view schematically showing charge transfer (FIG. 1C).

The present invention generally relates to a semiconductor apparatus and methods of manufacturing same. More specifically, the present invention relates to semiconductor apparatuses that include a conductor or a semiconductor and organic semiconductor molecules, and a manufacturing method for fabricating same.

In an embodiment of the present invention, it is preferred that the organic semiconductor molecules have at a terminal a functional group chemically bonded to the fine particles, and the organic semiconductor molecules and the fine particles are alternately bonded through the functional group at both terminals of the organic semiconductor molecules to form a conducting path in a network form such that the conducting path in the fine particles and the conducting path in the organic semiconductor molecules are two-dimensionally or three-dimensionally linked together.

In an embodiment, a structure is obtained such that charge transfer occurs in the conducting path only in the direction of the axis of the molecule along the main chains of the organic semiconductor molecules, and the mobility in the direction of the axis of the molecule, for example, high mobility due to delocalized π electrons may be fully utilized.

In an embodiment, there may be provided an organic semiconductor transistor which may realize an extremely high mobility comparable to the mobility of a monomolecular layer transistor.

In the present invention, it is preferred in an embodiment that a channel region having the conducting path is formed, source and drain electrodes are provided on both sides of the channel region, and a gate electrode is provided between the electrodes to constitute an insulated gate (e.g., metal oxide semiconductor: MOS) field effect transistor. This structure may operate as an optical sensor or the like when using, as organic semiconductor molecules having a conjugated system, a dye which absorbs a light around the visible region.

In this case, it is preferred that the field effect transistor is formed on a flexible substrate that includes an organic material, and further a gate insulating film on the gate electrode that includes an organic material.

In addition, it is preferred that the source and drain electrodes include the same material as that for the fine particles.

In the present invention, it is preferred in an embodiment that the conducting path is formed from a single-layer or multi-layer of a bonded product of the fine particles and the organic semiconductor molecules.

Specifically, in this case, a step of forming a layer of the fine particles and then permitting the organic semiconductor molecules to be brought into contact with the layer is performed once to form a single-layer of the bonded product, or, alternatively, this step may be repeated twice or more to form multi-layer.

In this case, it is preferred that the first layer of the fine particles is formed on a primary layer having good adhesion to the fine particles.

It is preferred that the primary layer includes a silanol derivative, specifically a silane coupling agent, and, in this case, the primary layer may be used as a gate insulating film on the gate electrode.

Accordingly, formation of the gate insulating film, e.g., oxide film does not require cost and time consuming process. Therefore, the construction of the whole transistor is simplified, thus reducing the number of steps in the fabrication process. In addition, the thickness of the whole transistor may be reduced, and further, the gate insulating film comprised of the primary layer may be formed by a production process using a solution, making it possible to reduce the cost for the apparatus and the time needed for the production.

For chemically bonding the substrate having the gate electrode to the fine particles through the silane coupling agent, it is essential that the silane coupling agent has at one terminal a functional group which may be reacted with the fine particles, such as an amino group, a thiol group, and the like, and at another terminal an alkoxy group or the like which may be reacted with a hydroxyl group on the substrate.

Specific examples of the silane coupling agents include N-2(aminoethyl)γ-aminopropylmethyldimethoxysilane, N-2(aminoethyl)γ-aminopropyltrimethoxysilane {AEAPTMS, structural formula (1) below}, N-2(aminoethyl)γ-aminopropyltriethoxysilane, 3-aminopropyltrimethoxysilane {APTMS, structural formula (2) below}, 3-aminopropylmethyldiethoxysilane {APMDES, structural formula (3) below}, 3-aminopropyltriethoxysilane, N-phenyl-3-aminopropyltrimethoxysilane, 3-mercaptopropyltrimethoxysilane {MPTMS, structural formula (4) below}, 3-mercaptopropylmethyldimethoxysilane {MPMDMS, structural formula (5) below}, mercaptomethyldimethylethoxysilane {MMDMES, structural formula (6) below}, mercaptomethylmethyldiethoxysilane {MMMDES, structural formula (7) below}, 3-cyanopropyldimethylmethoxysilane {CPDMMS, structural formula (8) below}, 3-cyanopropyltriethoxysilane {CPTES, structural formula (9) below}, 2-pyridylethyltrimethoxysilane {PETMS, structural formula (10) below}, 2-(diphenylphosphino)ethyltriethoxysilane {DPPETES, structural formula (11) below} and the like according to an embodiment. In addition to the above well-known silane coupling agents, new materials may be synthesized according to the use by changing the length of an alkyl chain in the molecule.

Structural formula (1):

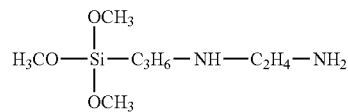

AEAPTMS

Structural formula (2):

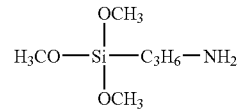

APTMS

Structural formula (3):

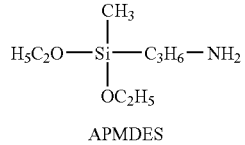

APMDES

Structural formula (4):

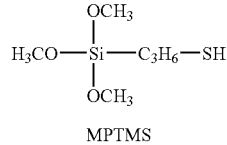

MPTMS

Structural formula (5):

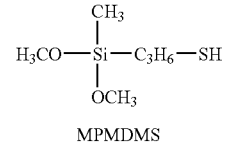

MPMDMS

Structural formula (6):

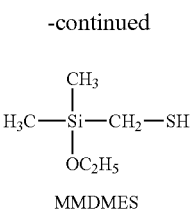

MMDMES

Structural formula (7):

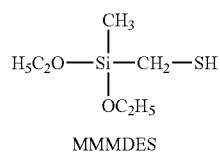

MMMDES

Structural formula (8):

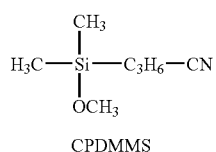

CPDMMS

Structural formula (9):

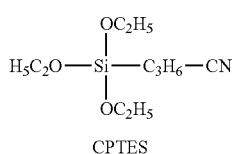

CPTES

Structural formula (10):

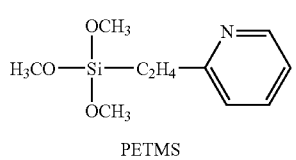

PETMS

Structural formula (11):

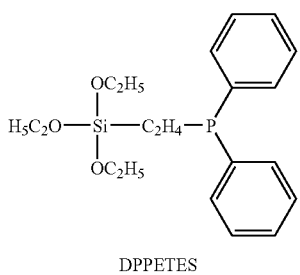

DPPETES

The above-listed general silane coupling agents are not all that may be used in the application in the present invention. The silane coupling agent may be capable of being chemically bonded to both the substrate having the gate electrode and the fine particles, and dithiol substances having thiol groups at both terminals may be used. As an example, there may be mentioned decanedithiol (HS—$C_{10}H_{20}$—SH) according to an embodiment.

The basic structure of the silane coupling agent is mainly a quasi-one-dimensional structure which may define the main chain, but it is not limited thereto, and two-dimensional or three-dimensional molecules may be used as long as the constituent portions to be bonded individually to the substrate and the fine particles are surely bonded to them. In this case, the transistor properties formed by a network structure that includes the fine particles should not suffer deterioration or damage.

Further, when using the primary layer as the gate insulating film, the silane coupling agent must be poor in electrical conductivity. Therefore, a silane coupling agent having an alkyl chain as a main chain may be used without any problem, but a silane coupling agent having a conjugated chain, which is considered to be conductive, is difficult to be used in the application in the present invention.

Further, instead of the silane coupling agent, a nucleic acid (DNA) or the like may be used.

In the present invention, it is preferred that the fine particles are fine particles that include, for example, gold, silver, platinum, copper, aluminum, the like or combinations as the conductor, or cadmium sulfide, cadmium selenide, silicon, the like or combinations as the semiconductor. The particle size is preferably about 10 nm or less in an embodiment.

As an example of the form of the fine particles, there may be mentioned sphere, but the form is not limited to this in the present invention, and, in addition to sphere, examples include triangle, cube, rectangular parallelopiped, cone and other suitable forms.

The fine particles include nanorods (or nanofiber) in an embodiment having a short diameter of about 10 nm or less and having an anisotropic form in the one-dimensional direction See, Ser-Sing Chang, Chao-Wen Shih, Cheng-Dah Chen, Wei-Cheng Lai, and C. R. Chris Wang, "The Shape Transition of Gold Nanorods" Langmuir (1999), 15, 701-709, nanotubes, other suitable materials or combinations thereof. In this case, it is preferred that the distance between the source and drain electrodes is smaller than the long diameter of the nanorods.

When the nanorods or nanotubes are used as the fine particles, even though the size (long diameter or short diameter) is inconsistent, they may be arranged in parallel orderly, as compared to spherical nanoparticles.

It is preferred in an embodiment that the organic semiconductor molecules are organic semiconductor molecules having a conjugated bond and having at both terminals of the molecule a thiol group (—SH), an amino group (—$NH_2$), an isocyano group (—NC), a thioacetoxyl group (—$SCOCH_3$), a carboxyl group (—COOH) or the like. Examples include 4,4'-biphenyldithiol (BPDT) of structural formula (12) below, 4,4'-diisocyanobiphenyl of structural formula (13) below, 4,4'-diisocyano-p-terphenyl of structural formula (14) below, 2,5-bis(5'-thioacetoxyl-2'-thiophenyl)thiophene of structural formula (15) below, 4,4'-diisocyanophenyl of structural formula (16) below, Bovin Serum Albumin, Horse Redish Peroxidase, antibody-antigen and the like. It is preferred in an embodiment that these are individually π conjugated system molecules and have at least two portions functional groups capable of being chemically bonded to the fine particles.

Structural formula (12):

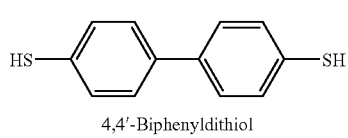

4,4'-Biphenyldithiol

Structural formula (13):

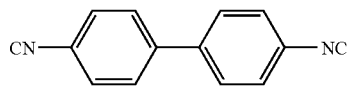

4,4'-Diisocyanobiphenyl

Structural formula (14):

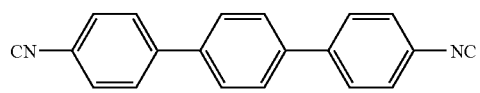

4,4'-Diisocyano-p-terphenyl

Structural formula (15):

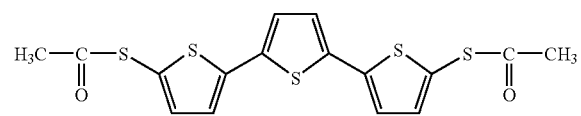

2,5-Bis(5'-thioacetoxyl-2'-thiophenyl)thiophene

Structural formula (16):

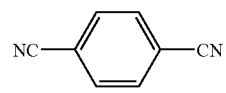

4,4'-Diisocyanophenyl

Further, as the organic semiconductor molecules, a dendrimer represented by structural formula (17) below can be used, according to an embodiment:

Structural formula (17):

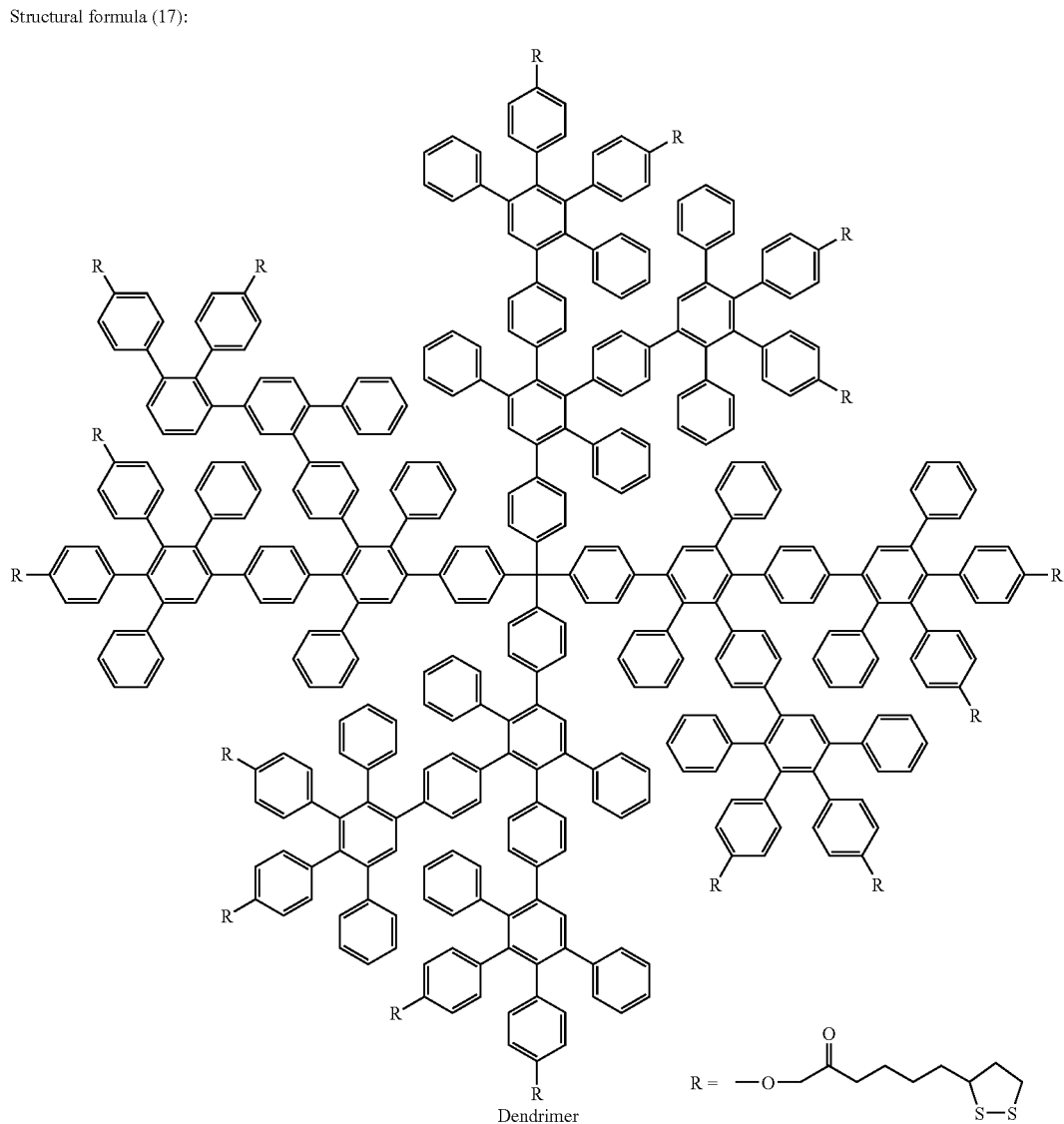

Dendrimer

Examples illustrative of the preferred embodiments of the present invention will be described in detail with reference to the drawings without limitation.

Example 1

MOS Field Effect Transistor

Figure 1B:
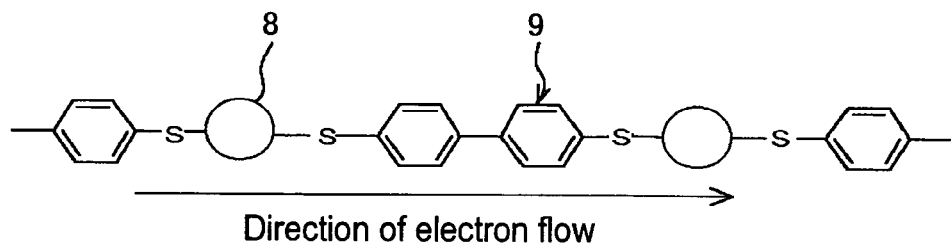
Figure 1C:
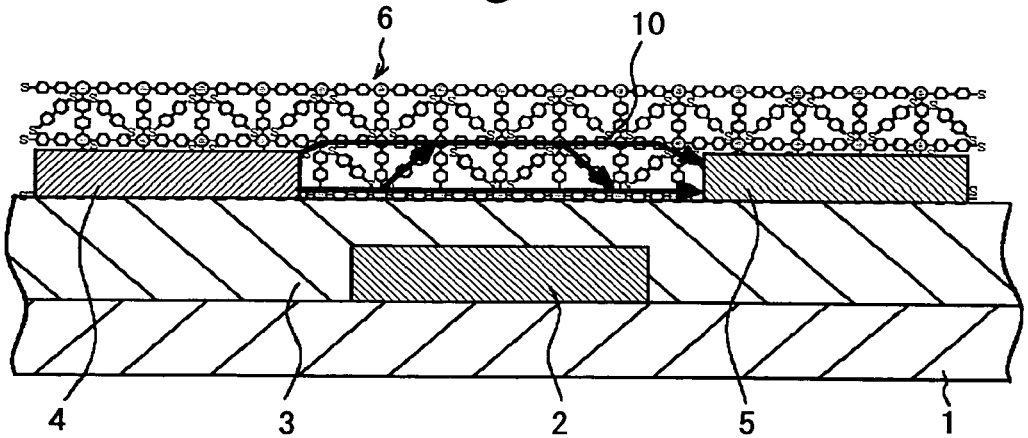

FIGS. 1A to 1C are views showing an example of a MOS field effect transistor according to an embodiment, including a diagrammatic cross-sectional view (FIG. 1A), an enlarged view of the essential portion (FIG. 1B), and a view schematically showing charge transfer (FIG. 1C).

FIG. 1A shows one form of a device structure of a MOS field effect transistor often used as a TFT, and a gate electrode 2, a gate insulating film 3, a source electrode 4, and a drain electrode 5 are first formed on a substrate 1 by a known technique, and then a channel layer 6 that includes a bonded product of fine particles 8 and organic semiconductor molecules 9 is formed thereon. The molecular solder layer (primary layer) that will be described below is not shown.

As the substrate 1, for example, a plastic substrate of polyimide, polycarbonate, or polyethylene terephthalate (PET), or a glass, quartz, silicon substrate or the like is used. When using a plastic substrate, there may be produced a semiconductor apparatus having a flexible form, such as a display having a curved form.

The transistor formed on the substrate 1 may be utilized, together with the substrate 1, as a monolithic integrated circuit having a number of transistors integrated, such as like when applied to a display device, or the individual transistor may be separated and utilized as a discrete part.

As a material for the gate electrode 2, for example, a conductive substance, such as a conductive polymer, gold (Au), platinum (Pt), aluminum (Al), nickel (Ni), titanium (Ti), or polysilicon, or the combination of these materials or the like can be used in an embodiment.

As a material for the gate insulating film 3, for example, polymethyl methacrylate (PMMA), spin on glass (SOG), silicon oxide ($SiO_2$), silicon nitride ($Si_3N_4$), a metal oxide high-dielectric-constant insulating film, or the combination of these materials or the like can be used in an embodiment.

As a material for the source electrode 4 and drain electrode 5, for example, a conductive substance, such as gold (Au), palladium (Pd), platinum (Pt), chromium (Cr), nickel (Ni), or a conductive polymer, or the combination of these materials or the like can be used in an embodiment.

In the present embodiment, the treatment temperature in the fabrication steps may be lowered to about 200° C. or lower, and therefore, all the above materials can include an organic compound in an embodiment.

The channel layer 6 is formed from a bonded product in which the fine particles 8 and the organic semiconductor molecules 9 are bonded together into a network form, and the gate voltage of the gate electrode 2 controls carrier transfer.

The fine particles 8 are fine particles having a particle size of about 10 nm or less, and, as a material therefor, for example, a conductor, such as gold (Au), silver (Ag), or platinum (Pt), or a semiconductor, such as cadmium sulfide (CdS), cadmium selenide (CdSe), or silicon (Si), the like and combinations thereof can be used in an embodiment.

As the organic semiconductor molecules 9, there are used organic semiconductor molecules having a conjugated bond in the molecule skeleton and having at a terminal of the molecule a functional group which may be chemically bonded to the fine particles 8, for example, a thiol group (—SH), an amino group (—$NH_2$), an isocyano group (—NC), a thioacetoxyl group (—$SCOCH_3$), a carboxyl group (—COOH) or the like. A thiol group, an amino group, an isocyano group, and a thioacetoxyl group are a functional group which may be bonded to conductor fine particles of Au or the like, and a carboxyl group is a functional group which may be bonded to semiconductor fine particles according to various embodiments.

Specific examples of the organic semiconductor molecules 9 include 4,4'-biphenyldithiol of structural formula (12) below, 4,4'-diisocyanobiphenyl of structural formula (13) below, 4,4'-diisocyano-p-terphenyl of structural formula (14) below, 2,5-bis(5'-thioacetoxyl-2'-thiophenyl)thiophene of structural formula (15) below, 4,4'-diisocyanophenyl of structural formula (16) below, Bovin Serum Albumin, Horse Redish Peroxidase, antibody-antigen and the like.

Structural formula (12):

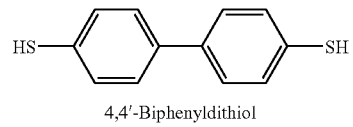

4,4'-Biphenyldithiol

Structural formula (13):

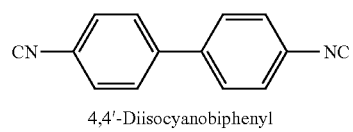

4,4'-Diisocyanobiphenyl

Structural formula (14):

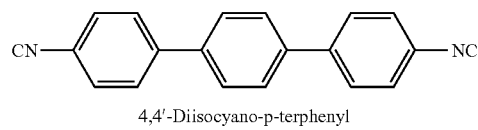

4,4'-Diisocyano-p-terphenyl

Structural formula (15):

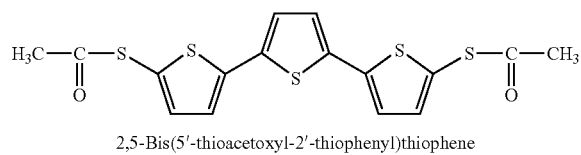

2,5-Bis(5'-thioacetoxyl-2'-thiophenyl)thiophene

Structural formula (16):

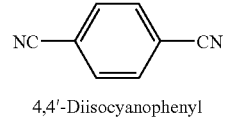

4,4'-Diisocyanophenyl

Further, as the organic semiconductor molecules 9, a dendrimer represented by structural formula (17) below can be used according to an embodiment.

Structural formula (17):

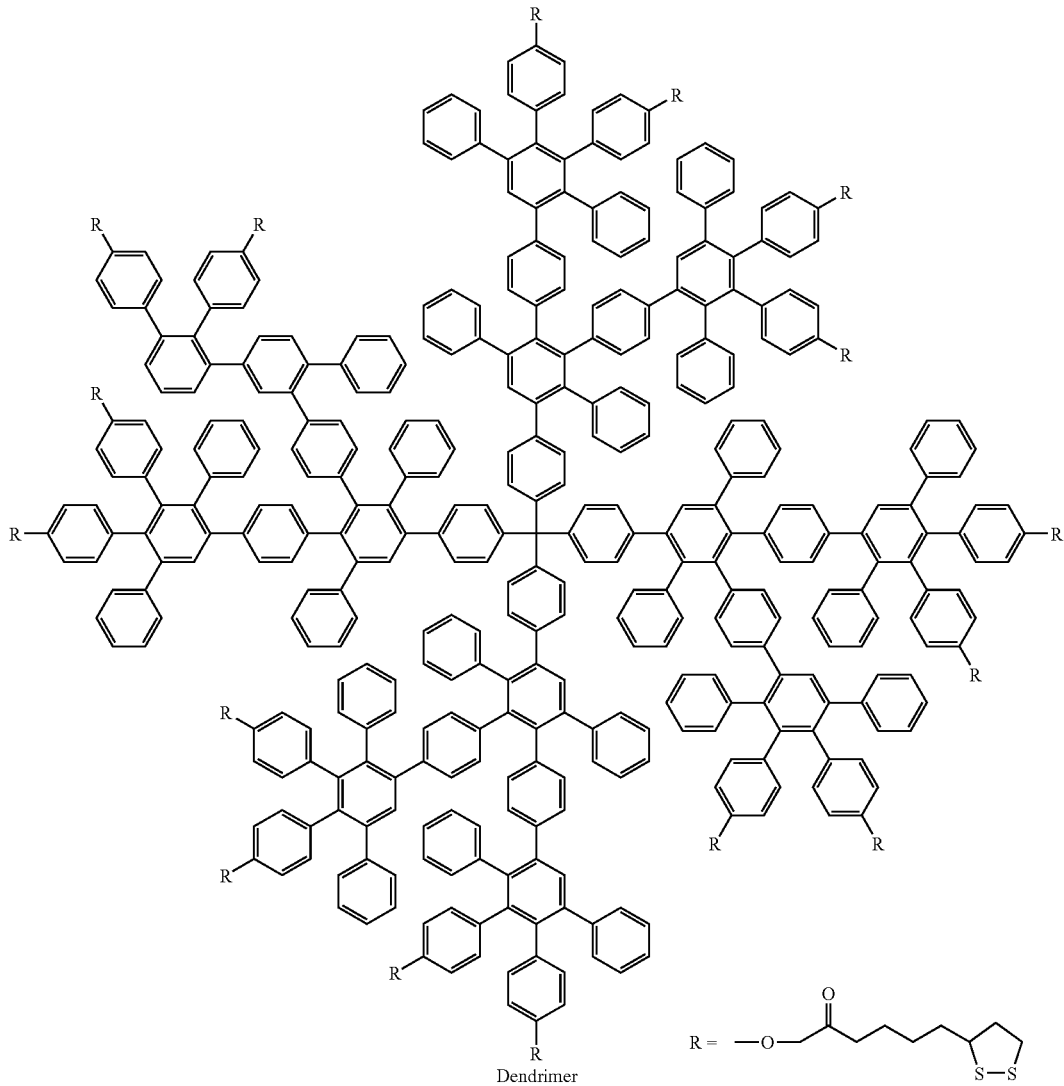

Dendrimer

In the channel layer 6, the fine particles 8 are two-dimensionally or three-dimensionally bonded by the organic semiconductor molecules 9 to form a conducting path in a network form such that the conducting path in the fine particles 8 and the conducting path along the molecule skeleton in the organic semiconductor molecules 9 are linked together.

As shown in the enlarged view of FIG. 1B, the conducting path contains no intermolecular electron transfer which is the cause of low mobility of the conventional organic semiconductors, and further intramolecular electron transfer occurs in the conjugated system formed along the molecule skeleton, and thus a high mobility is expected.

Electronic conduction in the channel layer 6 occurs through a conducting path 10 in a network form as shown in FIG. 1C, and the electrical conductivity of the channel layer 6 is controlled by a voltage applied to the gate electrode 2.

On the surface of the region of the substrate 1, in which the channel layer 6 is formed, a molecular solder layer (not shown) as the primary layer is formed wherein the molecular solder layer serves as an adhesive for immobilizing just one layer of the fine particles 8. As the molecules which serve as a solder, there are used molecules which are a silane compound and have a functional group capable of being chemically bonded to both the substrate having the gate electrode formed thereon and the fine particles.

For example, when the fine particles 8 and the source electrode 4 and drain electrode 5 include gold, (3-aminopropyl)trimethoxysilane (APTMS) or mercapto silane having an amino group or thiol group having an affinity with gold is used in an embodiment.

In the step of forming the channel layer 6, one layer of the fine particles 8 is formed, and then the organic semiconductor molecules 9 are brought into contact with the fine particles 8 to form a bonded product of the fine particles 8 and the organic semiconductor molecules 9, forming one layer of the bonded product. Accordingly, the channel layer 6 is formed layer by layer and hence, this step is repeated desired times to form the channel layer 6 having a desired thickness.

The channel layer 6 can include a single layer, but, generally 2 layers or more, preferably about 10 layers are required according to an embodiment. The thickness of one layer is not largely different from the particle size (several nm) of the fine particles 8. When the fine particles 8 are fine particles that include gold having a particle size of about 10 nm and 10 layers are stacked, the thickness of the channel layer 6 is about 100 nm. Therefore, it is preferred that the thickness of each of the source electrode 4 and the drain electrode 5 is about 100 nm or more in an embodiment.

The channel layer 6 is formed independently layer by layer. Therefore, the material constituting the fine particles 8 or the particle size of the fine particles 8, or the organic semiconductor molecules 9 may be changed per one bonded product layer or per a plurality of bonded product layers to control the properties of the channel layer.

In the MOS field effect transistor, in addition to FIG. 1A, a variety of structures may be considered, and any types of structures may be employed. The channel layer 6 is first formed, and then the source electrode 4 and the drain electrode 5 may be formed thereon by vapor deposition or the like, and the structure in this case is of, for example, a top gate type of FIG. 2A or a bottom gate type of FIG. 2B. Alternatively, the structure may be of a dual gate type of FIG. 2C, and, in this case, the electrical conductivity of the channel layer 6 may be more effectively controlled.

Example 2

Fabrication of MOS Transistor

Hereinbelow, the steps in the fabrication of the MOS field effect transistor according to Example 1 shown in FIG. 1A will be described with reference to FIGS. 3A to 3E and FIGS. 4A to 4D according to an embodiment. Here, as a material for electrodes 2, 4, 5 and fine particles 8, gold is used, as organic semiconductor molecules 9, 4,4'-biphenyldithiol is used, and as a solder molecular layer 7 (silane coupling agent), (3-aminopropyl)trimethoxysilane (APTMS) is used.

First, a gate electrode 2, a gate insulating film 3, a source electrode 4, and a drain electrode 5 are formed on a substrate 1 using a known method.
Step 1

As the substrate 1, for example, a plastic substrate of polyimide, polycarbonate or the like, or a glass, quartz, or silicon substrate is used.

Gold (Au) is deposited on the substrate 1 with a mask on an undesired portion to form a gate electrode 2. As a material for the gate electrode 2 other than gold (Au), for example, a conductive substance, such as a conductive polymer, platinum (Pt), aluminum (Al), nickel (Ni), or titanium (Ti), or the combination of these materials or the like may be used, and the electrode is formed by a lift-off method, a shadow mask method, a screen printing method, an ink jet printing method, or the like.
Step 2

Subsequently, a gate insulating film 3 is formed by a spin coating process, a sputtering process, a dipping process, a casting process, or the like. As a material for the gate insulating film 3, for example, polymethyl methacrylate (PMMA), spin on glass (SOG), silicon oxide ($SiO_2$), silicon nitride ($Si_3N_4$), a metal oxide high-dielectric-constant insulating film, or the combination of these materials or the like may be used.
Step 3

Gold (Au) is deposited on the gate insulating film 3 with a mask on an undesired portion to form a source electrode 4 and a drain electrode 5. As a material for the source electrode 4 and the drain electrode 5 other than gold (Au), for example, a conductive substance, such as palladium (Pd), platinum (Pt), chromium (Cr), nickel (Ni), or a conductive polymer, or the combination of these substances or the like may be used, and the electrode is formed by a lift-off method, a shadow mask method, a screen printing method, an ink jet printing method, or the like.

Next, a channel layer 6 that includes fine particles 8 and organic semiconductor molecules 9, which are bonded together into a three-dimensional network structure, is formed.
Step 4

First, the surface of the region, in which the channel layer 6 is formed, is dipped in a solution of (3-aminopropyl)trimethoxysilane (APTMS) in toluene or hexane having a concentration of several % by volume, and then washed with toluene or hexane so that the solution is replaced by it, and the solvent is evaporated to form a molecular solder layer 7 as the primary layer for immobilizing just one layer of gold fine particles 8. Instead of APTMS, for example, mercapto silane can be used in an embodiment.
Step 5

Next, the substrate 1 having the molecular solder layer 7 formed thereon is dipped in a dispersion (concentration: several mM) of the gold fine particles 8 in a solvent, such as toluene or chloroform, for several minutes to several hours, and then the solvent is evaporated, so that the gold fine particles 8 are immobilized onto the surface of the molecular solder layer 7, thus forming a gold fine particle layer 8a comprised of the gold fine particles 8 on the molecular solder layer 7.

The molecular solder layer 7 has a functional group, such as an amino group, which may be chemically bonded to the gold fine particles 8, and only one layer of the gold fine particle layer 8a which may be bonded to the functional group is immobilized onto the molecular solder layer 7. The excess gold fine particles 8 which are not immobilized onto the molecular solder layer 7 are washed out.
Step 6

Subsequently, the substrate 1 is dipped in a solution of 4,4'-biphenyldithiol as organic semiconductor molecules 9 in toluene having a molar concentration of several mM or less, and then washed with toluene so that the solution is replaced by it, and then the solvent is evaporated. In this instance, 4,4'-biphenyldithiol is bonded to the surfaces of the gold fine particles 8 through a reaction of a thiol group at a terminal of the molecule. A number of 4,4'-biphenyldithiol molecules are bonded to the surface of one gold fine particle 8 so that they wrap the gold fine particle 8. Part of them are bonded also to other gold fine particles 8 through a reaction of a thiol group at another terminal of the molecule, thus forming a bonded product layer 6a as the first layer in which the gold fine particles 8 are bonded together into a two-dimensional network by the 4,4'-biphenyldithiol molecules.

A number of unreacted thiol groups of 4,4'-biphenyldithiol remain on the surface of the bonded product layer 6a, and therefore the surface of the bonded product layer 6a has a large bonding force with respect to the gold fine particles 8.
Step 7

Next, in the same manner as in the step 5, the substrate 1 is dipped in a dispersion of the gold fine particles 8 in a solvent, such as toluene or chloroform, for several minutes to several hours, and then the solvent is evaporated, so that the gold fine particles 8 are bonded and immobilized onto the surface of the bonded product layer 6a as the first layer, thus forming a gold fine particle layer 8b as the second layer.

Here, the gold fine particles 8 in the second layer are bonded to the gold fine particles 8 in the first layer through 4,4'-biphenyldithiol, and further, the gold fine particles 8 in the first layer similarly bonded to the gold fine particles 8 in the second layer are bonded together indirectly through the gold fine particles 8 in the second layer, rendering the bonding three-dimensional.

Step 8

Subsequently, in the same manner as in the step 6, the substrate 1 is dipped in a solution of 4,4'-biphenyldithiol in toluene having a molar concentration of several mM or less, and then washed with toluene so that the solution is replaced by it, and then the solvent is evaporated. Like in the step 6, a number of 4,4'-biphenyldithiol molecules are bonded so that they wrap the gold fine particles 8, forming a bonded product layer 6b as the second layer in which the gold fine particles 8 are bonded together by the 4,4'-biphenyldithiol molecules.

Step 9

Then, by repeating the step 7 and the step 8, the channel layer, in which a conducting path in a three-dimensional network form is formed, may be formed layer by layer. By appropriately selecting the frequency of the repetition of the steps, the channel layer 6 having a desired thickness may be formed. See M. D. Musick et al., Chem. Mater. (1997), 9, 1499; and Chem. Mater. (2000), 12, 2869).

In FIGS. 3A to 3E and FIGS. 4A to 4D, each bonded product layer is formed from the same material, but the material constituting the fine particles 8 or the particle size of the fine particles 8, or the organic semiconductor molecules 9 may be changed per one bonded product layer or per a plurality of bonded product layers to control the properties of the channel layer. The channel layer 6 is formed also on the source electrode 4 and drain electrode 5, but the channel layer 6 may be formed only in the recess portion between the electrodes.

Figure 2A:
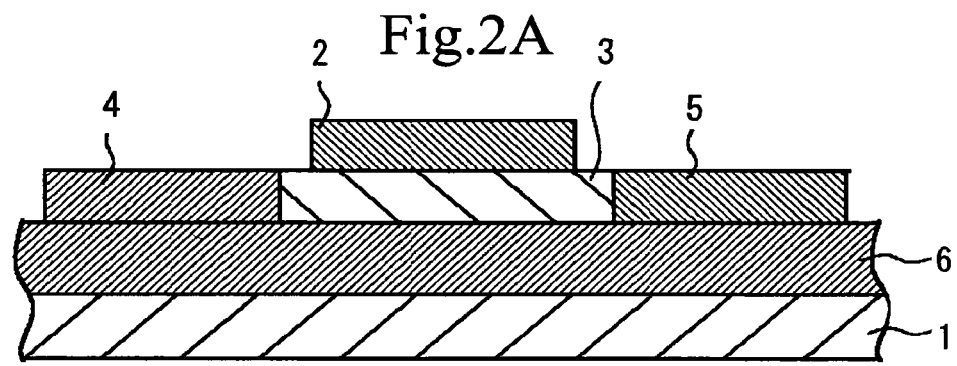
FIGS. 2A to 2C are diagrammatic cross-sectional views showing another structure of the MOS field effect transistor according to an embodiment of the present invention.
Figure 2B:
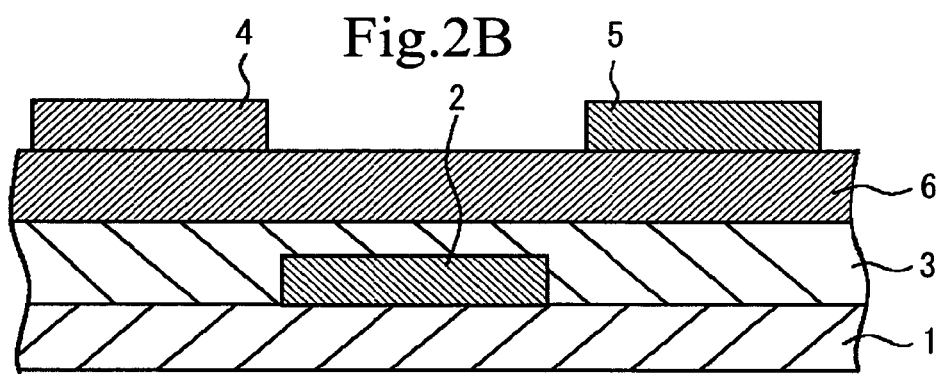
Figure 2C:
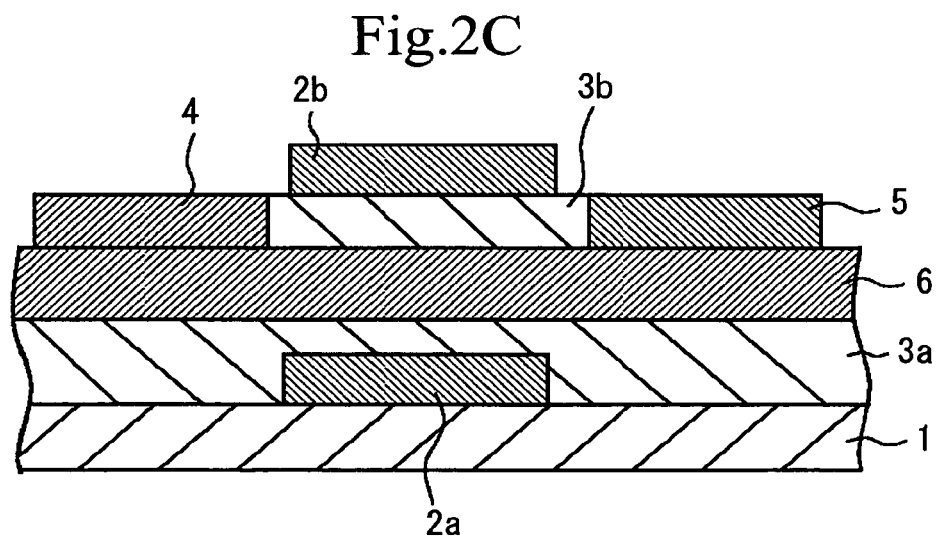
Figure 4A:
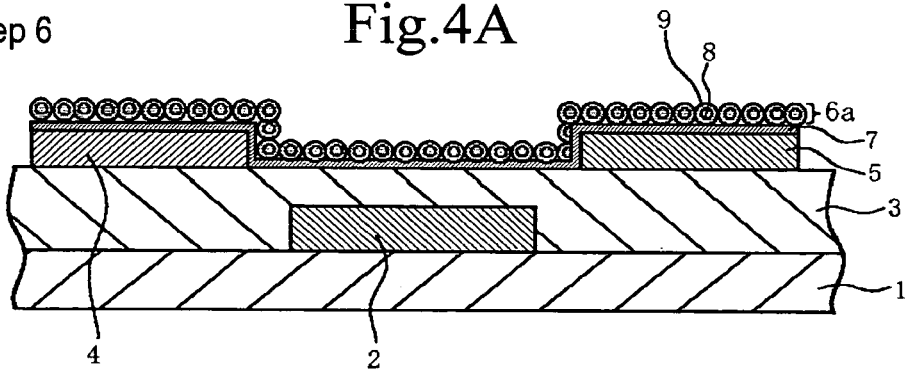
FIGS. 4A to 4D are diagrammatic cross-sectional views showing the steps in the fabrication of the MOS field effect transistor according to an embodiment of the present invention.
Figure 4B:
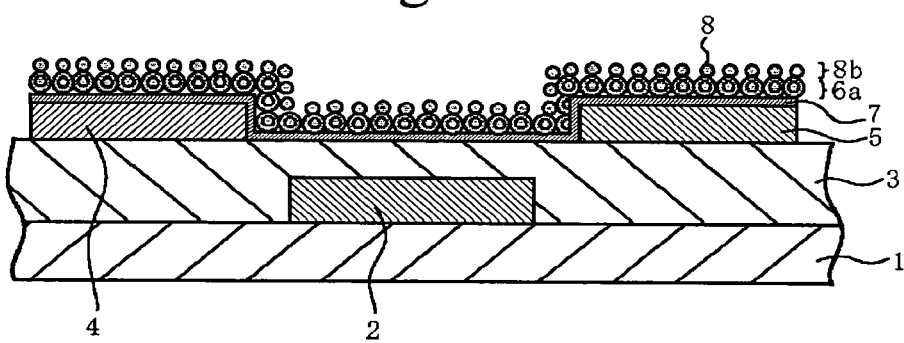
Figure 4C:
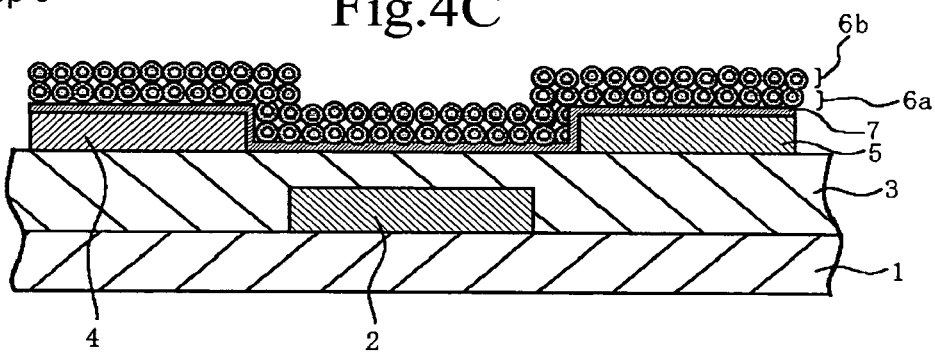
Figure 4D:
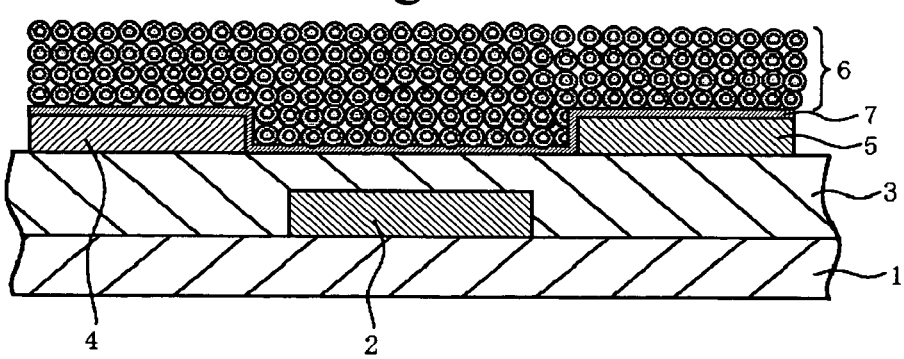

Alternatively, only the channel layer may be separately formed preliminarily, and deposited on the substrate 1 or gate insulating film 3 to prepare a field effect transistor of the structure of FIG. 2A or 2B.

Example 3

In the above Examples 1 and 2, since nanoparticles of gold or the like are used as the fine particles, how to orderly deposit the fine particles on the substrate and how to bridge the gap between the fine particles with the organic semiconductor molecules having a predetermined length are important.

Nanometer size particles that include clusters of several hundred to several thousand metal atoms and have, accurately, a form of polyhedron, but it is considered that they are nearly spherical. The width of the particle size distribution of nanoparticles may be changed depending on the raw material. The small width of the distribution means that the particle size is uniform, and, when a two-dimensional network is formed using particles having a small width of the particle size distribution, the resultant network is ordered like an optimally closed-packed structure. In contrast, when using particles having an inconsistent particle size, it is difficult to form an ordered two-dimensional network.

The effect of the particle size distribution of gold nanoparticles on bonding of the particles to the substrate is described below.

Figure 5:
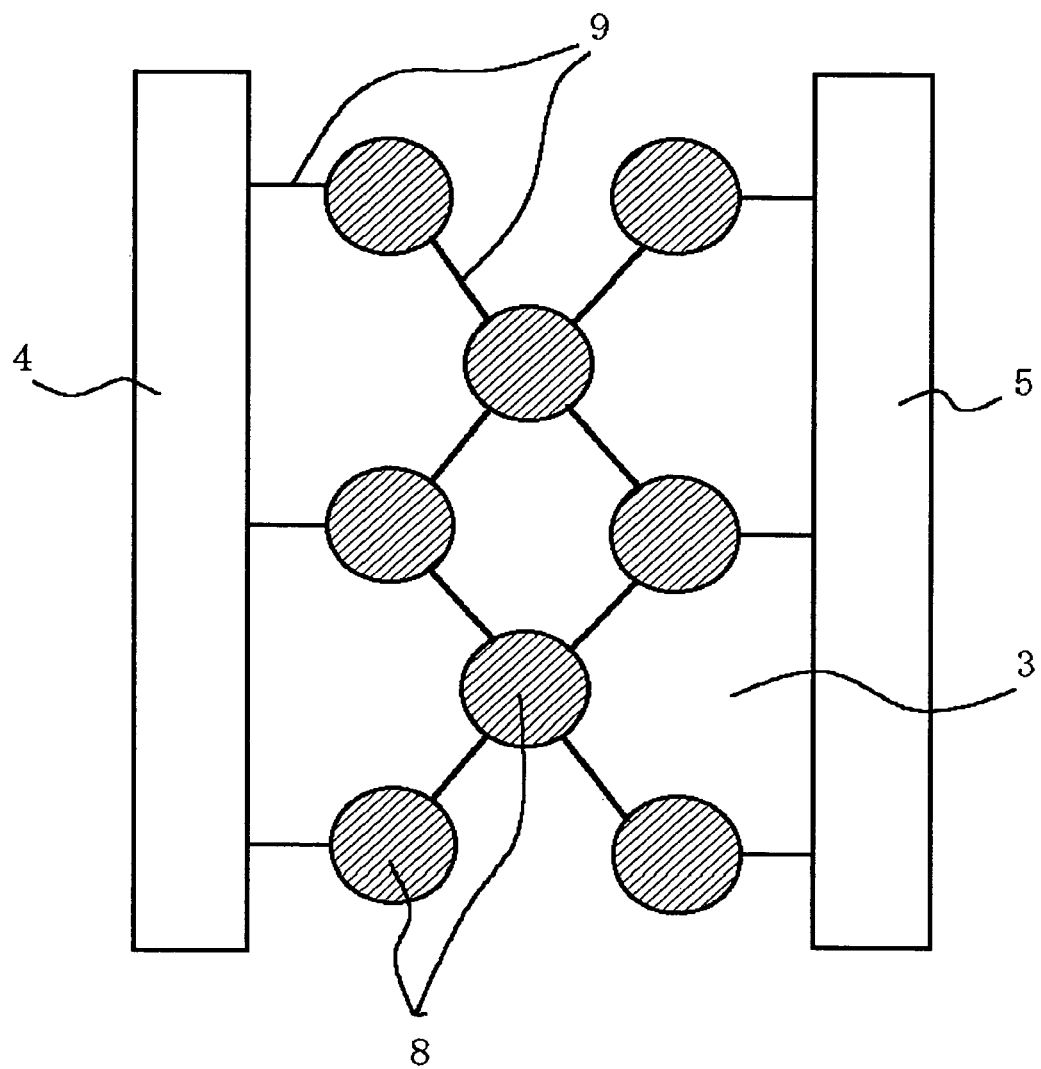
FIG. 5 is a partially enlarged, diagrammatic cross-sectional view showing the structure of a MOS field effect transistor according to an embodiment of the present invention.

As shown in the schematic view of FIG. 5 of an organic semiconductor transistor as the semiconductor apparatus of the present invention, in a space between the macro-size source electrode 4 and drain electrode 5 in which the gate insulating film 3 is exposed, nanoparticles (e.g., gold fine particles 8) are orderly bonded together, and the organic semiconductor molecules 9 are bonded to the nanoparticles. Here, the surfaces of the nanoparticles are coated with a protective film comprised of linear insulating organic molecules, and hence the nanoparticles do not undergo aggregation.

The insulating organic molecules are bonded to metal clusters (nanoparticles) corresponding to nucleus portions, and their bonding force remarkably affects the ultimate particle size distribution of the nanoparticles synthesized.

The insulating organic molecules have at one terminal a functional group which may be chemically reacted with (bonded to) the nanoparticles. Examples of functional groups include a thiol group (—SH), or the like, and examples of molecules having a thiol group at a terminal include dodecanethiol ($C_{12}H_{25}SH$) or the like. It is believed that a thiol group is bonded to the nanoparticles of gold or the like and then a hydrogen atom is eliminated to form $C_{12}H_{25}S$—Au.

Figure 6:
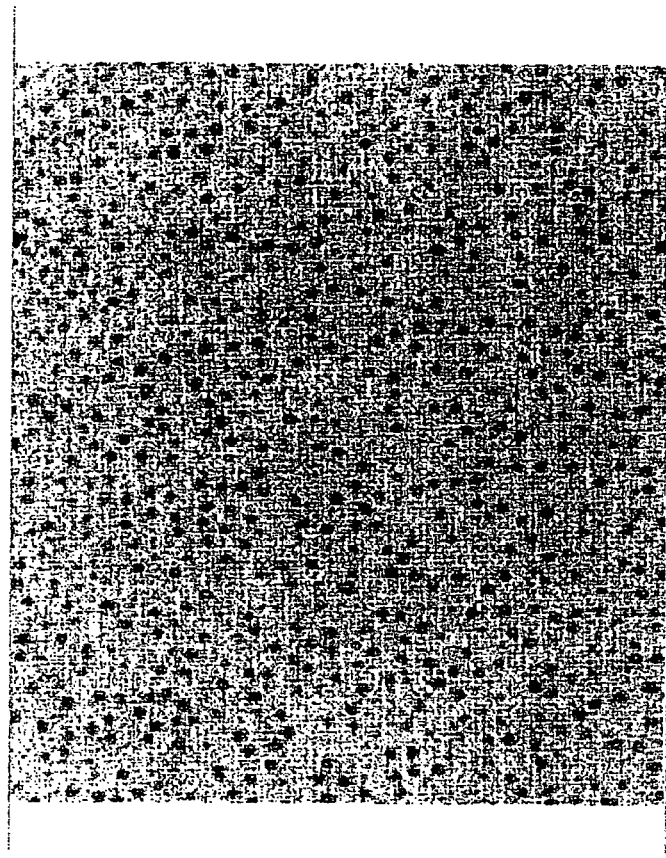
FIG. 6 illustrates a transmission electron microphotograph of gold nanoparticles using dodecanethiol as a protective film for the gold nanoparticles according to an embodiment of the present invention.

FIG. 6 illustrates a transmission electron microphotograph of gold nanoparticles actually synthesized using dodecanethiol as the protective film. As is apparent from FIG. 6, the particle size of the gold nanoparticles is very uniform. (With respect to the preparation of the gold nanoparticles using the insulating organic molecules having a thiol group as the protective film, refer to an article by Mathias Brust, et al., J. Chem. Soc., Chem. Commun., 801 (1994)).

Figure 7:
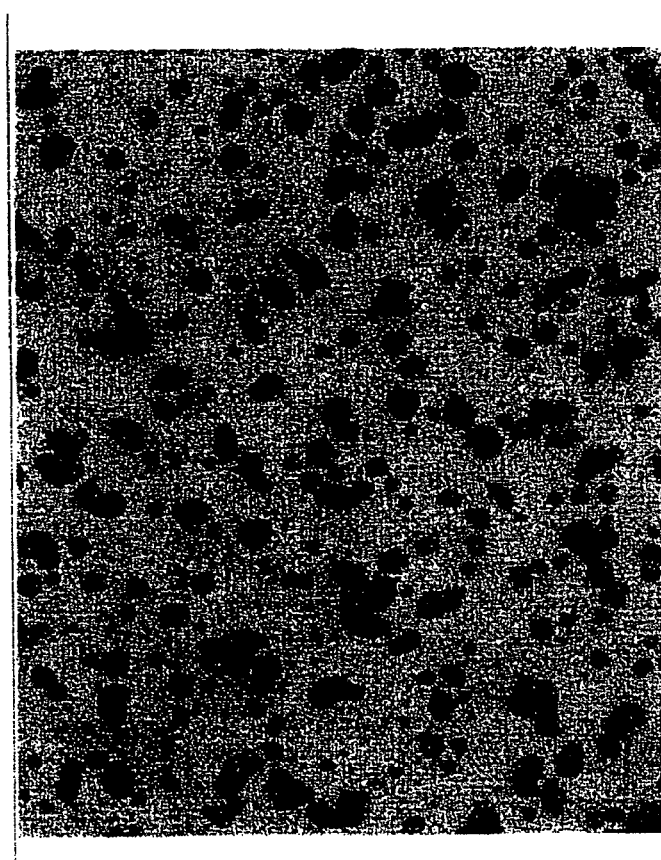
FIG. 7 illustrates a transmission electron microphotograph of gold nanoparticles (manufactured and sold by Harima Chemicals, Inc.) using organic molecules having an amino group at a terminal as a protective film for the gold nanoparticles according to an embodiment of the present invention.

Further, examples of the functional groups which may be chemically reacted with (bonded to) the nanoparticles include an amino group or the like. FIG. 7 illustrates a transmission electron microphotograph of gold nanoparticles actually synthesized using as the protective film the insulating organic molecules having an amino group as a terminal functional group. As is apparent from FIG. 7, the particle size of the gold nanoparticles is larger than that in the case of the thiol group in FIG. 6. (With respect to the preparation of the gold nanoparticles using the insulating organic molecules having an amino group as the protective film, refer to an article by Daniel V. Leff, et al., Langmuir 12, 4723 (1996).)

It is generally known that the "thiol group-gold" bonding is stronger than the "amino group-gold" bonding. When gold nanoparticles are synthesized using the insulating organic molecules having an amino group as the protective film, it is considered that, before the insulating organic molecules completely wrap nanoparticles (gold atoms), the organic molecules and other nanoparticles (gold atoms) possibly undergo aggregation due to the generally weaker "amino group-gold" bonding, so that particles having a larger particle size are likely to be formed. In addition, even after the nanoparticles having an amino group are wrapped by the protective film, there are some nanoparticles seen to be linked to one another.

Figure 8:
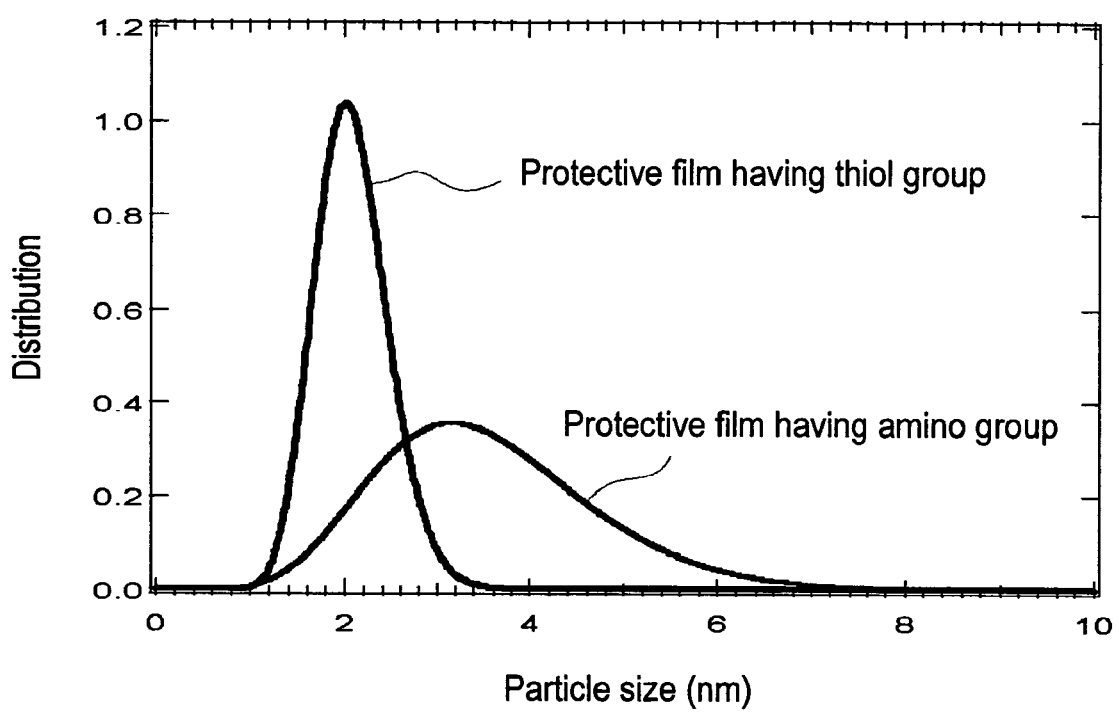
FIG. 8 shows the particle size distribution of gold nanoparticles as measured and analyzed by X-ray small angle scattering according to an embodiment of the present invention.

The results of measurement and analysis of the particle size distribution of the gold nanoparticles actually synthesized using the insulating organic molecules having a thiol group or an amino group by X-ray small angle scattering (transmission type) are shown in FIG. 8. As is apparent from FIG. 8, the particle size of the gold nanoparticles protected by a thiol group is smaller than that of the gold nanoparticles protected by an amino group, and the particle size distribution is narrower. This result clearly reflects the results of observation in FIGS. 6 and 7.

Next, with respect to the deposition of the above-described nanoparticles on a substrate, a difference between the nanoparticles having a uniform particle size and the nanoparticles having an inconsistent particle size is described.

Figure 9:
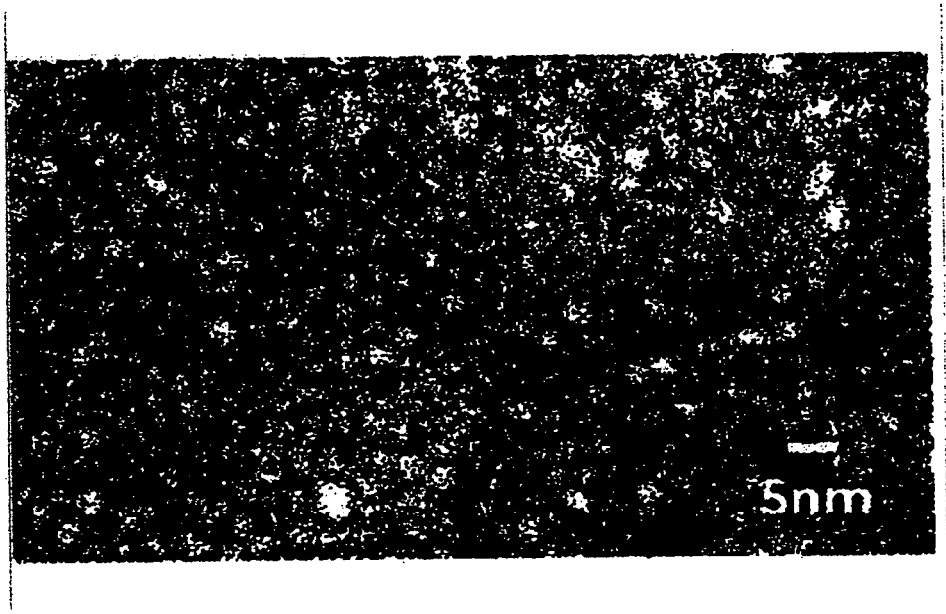
FIG. 9 illustrates a scanning electron microphotograph of a $SiO_2/Si$ substrate having formed thereon a bonded product of the organic semiconductor molecules having an amino group at a terminal and gold nanoparticles (manufactured and sold by Harima Chemicals, Inc.) according to an embodiment of the present invention.

FIG. 9 illustrates a scanning electron microphotograph of gold nanoparticles which have on the surface the protective film that include the insulating organic molecules having an amino group, and which are deposited as a single layer on a substrate. In the portion in which the particles are packed, particles are not orderly arranged, rather, particles having inconsistent sizes are irregularly put together and disposed, although the reason for this resides in that the process of deposition for the gold nanoparticles has not jet been optimized.

Figure 10:
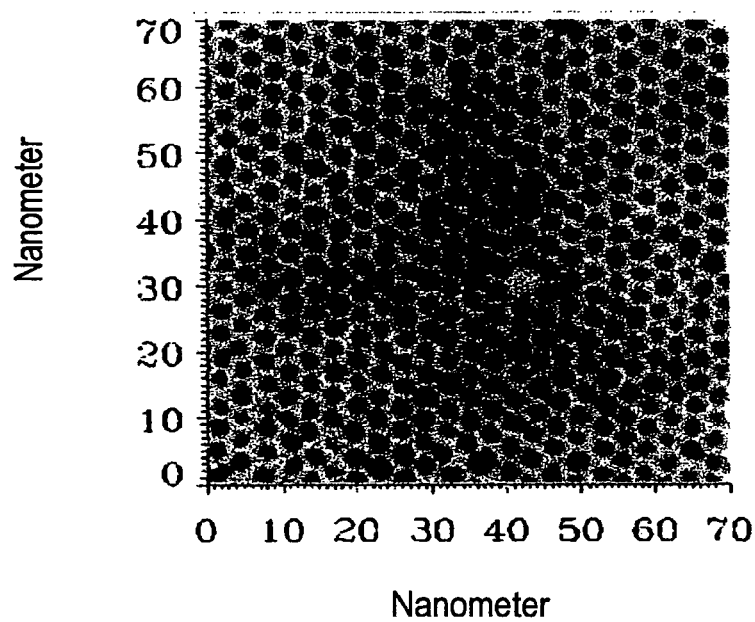
FIG. 10 illustrates a transmission electron microphotograph of dodecanethiol as the organic semiconductor molecules and gold nanoparticles, which are orderly deposited on a $MoS_2$ substrate according to an embodiment of the present invention.

FIG. 10 illustrates a transmission electron microphotograph of gold nanoparticles which have on the surface the protective film that include the insulating organic molecules having a thiol group and have an extremely uniform particle size, and which are deposited as a single layer on a substrate. This illustration of the transmission electron microphotograph is from the studies of Professor Andres of Purdue University in U.S.A., et al. See FIG. 1 in the article of R. P. Andres, et al. J. Vac. Sci. Technol. A 14, 1178 (1996). As can be seen from FIG. 10, the gold nanoparticles are extremely orderly deposited and optimally closed-packed, excluding several defects.

From the above, the nanoparticles having an inconsistent particle size appear to be difficult to be orderly arranged two-dimensionally.

Therefore, in the present embodiment, instead of the nanoparticles having a quasi-zero dimensional form, nanorods (or nanotubes) of gold or the like having a more one-dimensional form are used as the fine particles. In this case, even though the size (long diameter or short diameter) is inconsistent, they may be arranged in parallel orderly, as compared to spherical nanoparticles. In addition, even when the short diameter is inconsistent between the nanorods, the nanorods are likely to be arranged in parallel when attention is paid to one nanorod.

When the nanorods are used as the fine particles, the organic semiconductor molecules bridge the gap between the nanorods to form a transistor. The use of one organic semiconductor molecule means that a predetermined length is required between the nanorods (or nanoparticles), clearly indicating that the rods (particles) orderly disposed are very important.

Synthesis of the nanorods has conventionally been carried out, and ones having a short diameter as small as about 10 nm, and ones having a long diameter of from several tens nm to a submicron size, e.g., longer than about 500 nm have been synthesized. Further, very one-dimensional rods having an aspect ratio of up to 20 may be synthesized. See articles of Ser-Sing Chang, et al., Langmuir 15, 701 (1999); and Hiroshi Yao, et al., Chemistry Letters, 458 (2002).

In the nanorods, ammonium bromide molecules, typically cetyltrimethylammonium bromide molecules are used as a protective film for the nanorods in an embodiment. These are electrochemically prepared in a water-soluble electrolyte. Therefore, one referred to as protective film here is a general "surfactant". Cetyltrimethylammonium bromide is a "cationic surfactant", and bromine cations adhere to nanorods of gold or the like. In other words, the nanorods of gold or the like are formed in surfactant micelles.

Figure 11:
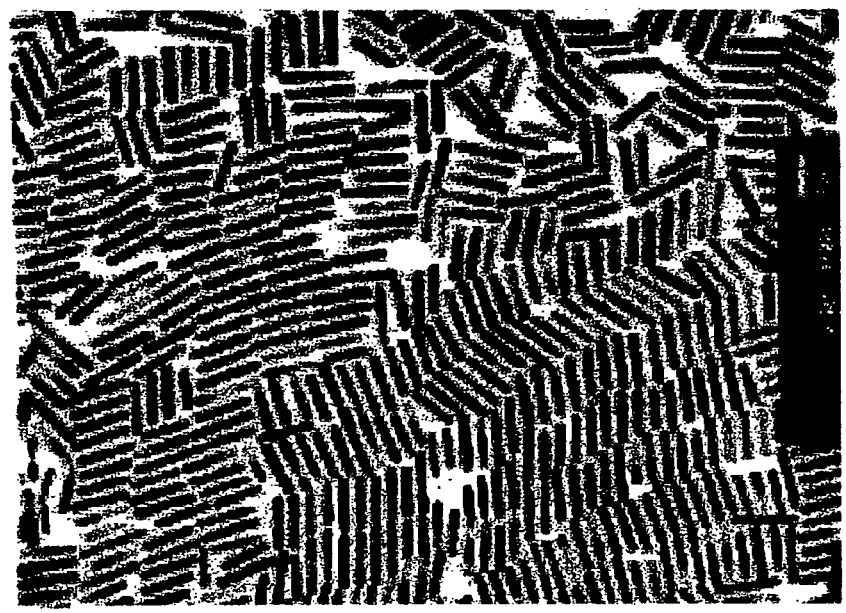
FIG. 11 illustrates a transmission electron microphotograph of gold nanorods having an aspect ratio of 6:1 (short diameter=10.6 nm, long diameter=62.6 nm) according to an embodiment of the present invention.

There has not been an example in which the nanorods of gold or the like are bonded onto a substrate, but it has been reported that many rods are orderly arranged in a simple process for observation of the particle size, in which a solution of gold nanorods is dropped on a grid for the examination through transmission electron microscope and the solvent is evaporated. FIG. 11 illustrates a transmission electron microphotograph. See, Ser-Sing Chang, et al., Langmuir 15, 701 (1999). The gold nanorods in FIG. 11 have an aspect ratio of 6:1, a short diameter of 10.6 nm, and a long diameter of 62.6 nm.

This suggests that the nanorods may be used as the fine particles instead of the nanoparticles in the fabrication of organic semiconductor transistors. It is expected that optimization of the process of bonding the nanorods to a substrate is easy, as compared to that for the nanoparticles.

In this case, it is preferred that the distance between the source electrode and the drain electrode in the transistor structure is smaller than the long diameter of the nanorods.

In this case, a substrate having parallel electrodes (source and drain electrodes), which are formed so that the distance between the electrodes is smaller than the long diameter of the nanorods, is dipped in a solution of nanorods to bond the nanorods to the substrate. The nanorods having a long diameter smaller than the distance between the electrodes may be put onto the gate insulating film between the parallel electrodes only when the nanorods are parallel to the electrodes.

Figure 12A:
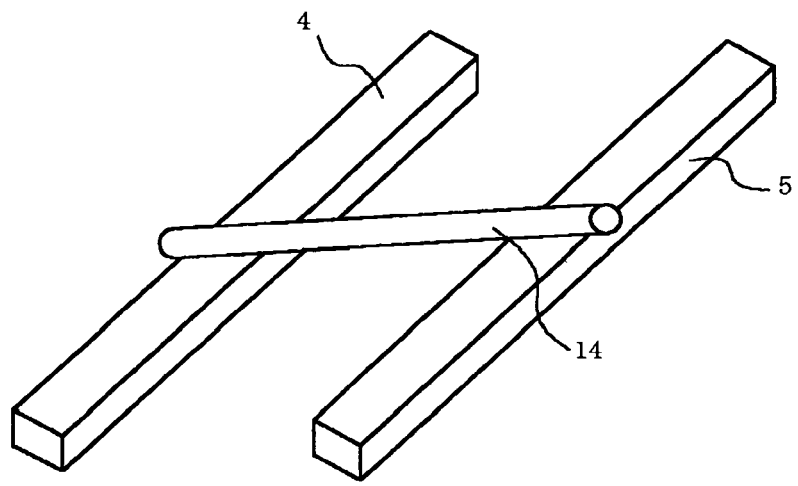
FIGS. 12A to 12B are schematic views of nanorods used as the fine particles according to an embodiment of the present invention.
Figure 12B:
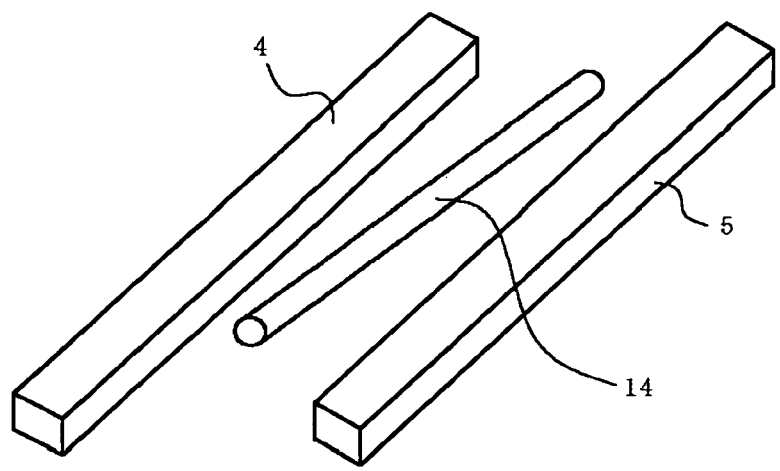

FIG. 12A is a schematic view of a source electrode 4, a drain electrode 5, and a nanorod 14 in a transistor structure formed so that the distance between the source electrode 4 and the drain electrode 5 is smaller than the long diameter of the nanorod 14 and the nanorod 14 is at a large angle to the electrodes 4, 5. In this case, it is considered that, when a certain external action (for example, shaking of the container of a nanorod solution in which a substrate is dipped is considered), the angle between the nanorod 14 and the electrode is changed and the nanorod 14 is disposed between the electrodes 4, 5 as shown in FIG. 12B. On the other hand, the nanorods 14 which are not disposed between the electrodes 4, 5 even after receiving the external action may be removed by taking out the substrate from the nanorod solution and then washing the substrate with a solvent or the like.

In this case, for preventing the nanorod 14 disposed between the electrodes 4, 5 from being removed, for example, a silane coupling agent is preliminarily applied to a portion between the electrodes 4, 5 on the substrate, and the nanorod 14 may be formed on the silane coupling agent.

Figure 13:
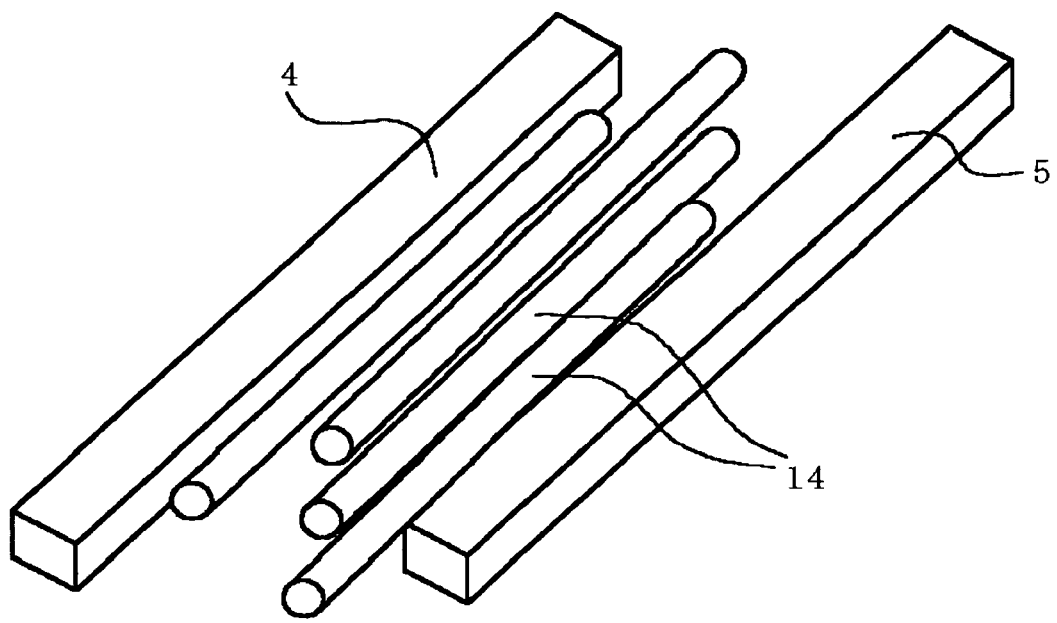
FIG. 13 is a schematic view of nanorods used as the fine particles according to an embodiment of the present invention.

FIG. 13 is a schematic view of a plurality of nanorods 14 disposed in parallel between electrodes 4, 5 utilizing the one-dimensional properties of the nanorods 14.

After the nanorods 14 are formed on the substrate, the organic semiconductor molecules may be bonded to the nanorods 14 in the same manner as that mentioned above to form a channel layer, thus preparing a transistor.

In this case, the channel layer can include a single layer, but, generally 2 layers or more, preferably about 10 layers in an embodiment. The thickness of one layer is not largely different from the short diameter (10 nm or less) of the nanorods. When the fine particles are nanorods that include gold having a particle size of about 10 nm and 10 layers are stacked, the thickness of the channel layer is about 100 nm. Therefore, it is preferred that the thickness of each of the source electrode and the drain electrode is about 100 nm or more.

Here, according to the studies of Ser-Sing Chang et al. See, Ser-Sing Chang, et al., Langmuir 15, 701 (1999), it is reported that a thiol group may be reacted with gold nanorods surrounded by micelles. They use mercaptopropyltrimethoxysilane. A thiol group is bonded to gold and hence, in this case, a methoxy group points outward. It is expected that the use of, for example, dithiol conjugated system organic semiconductor molecules as the organic semiconductor molecules in the fabrication of an organic semiconductor transistor makes it possible to bridge the gap between the gold nanorods surrounded by micelles.

Example 4

In the above examples, the channel layer includes a material that includes the organic semiconductor molecules and the fine particles. The organic semiconductor molecules have at a terminal a group which may be chemically bonded to the fine particles. Then, a structure in which the organic semiconductor molecules and the fine particles are alternately bonded to one another is formed, thus forming a network. In addition, using the material having a network comprising the organic semiconductor molecules and the fine particles as a channel material, an MIS (metal insulator semiconductor) type FET (field effect transistor) may be formed.

Generally, the gate insulating film used in a general transistor using silicon as a base is silicon oxide ($SiO_2$). As a preparation method therefor, a thermal oxidation method in which a silicon substrate is treated at a high temperature is generally used.

In the "organic transistor" using a semiconducting organic substance in a channel layer, which is attracting attention recently, a production process using a solution utilizing the properties of an organic substance is desirable also from a commercial point of view. The conventional transistor using silicon requires vacuum, high temperature, lithography and the like in the process, and hence needs very long time, high energy, and high cost. Further, shrinking is rapidly progressing currently, and the development of a transistor having a much smaller structure requires an investment even larger than ever needed, and its increase rate is the to increase extremely rapidly.

On the other hand, many organic substances are soluble in solvents, and therefore a technique for fabricating a transistor employing a production process using a solution is desirable. Specific examples of methods include a method in which a substrate is dipped in a solution, a method in which a solution is applied onto a substrate by means of a dropping pipette or the like to form a thin film by means of a spin coater or the like, and a method in which a thin film is formed using a printing technique, such as an ink jet printer. By using these process techniques, a thin film may be formed on a large area at one time, and neither vacuum nor high temperatures are required and a complicated large apparatus is not needed, and thus the cost may be suppressed, and these techniques are expected as a promising process for fabricating a transistor.

Therefore, ideally, it is more advantageous that all the substrate, the electrodes, the insulating layer, and the semiconductor channel layer may be formed from an organic substance. However, in many of the current "organic transistors", only the channel layer in the transistor is formed from an organic substance (specifically, the gate insulating film is comprised of $SiO_2$, and the substrate is comprised of silicon or the like), and the conventional vacuum vapor deposition process is often used as a process for forming a layer, and thus the properties of an organic substance are not utilized.

In view of the above, in the present embodiment, a layer of the fine particles is formed on the primary layer (the above-described molecular solder layer) having good adhesion to the fine particles, and, as the primary layer, a silanol derivative, specifically a silane coupling agent is used. In this case, the primary layer not only may immobilize the fine particles constituting the channel layer in the transistor but also may be used as a gate insulating film simultaneously.

Figure 14A:
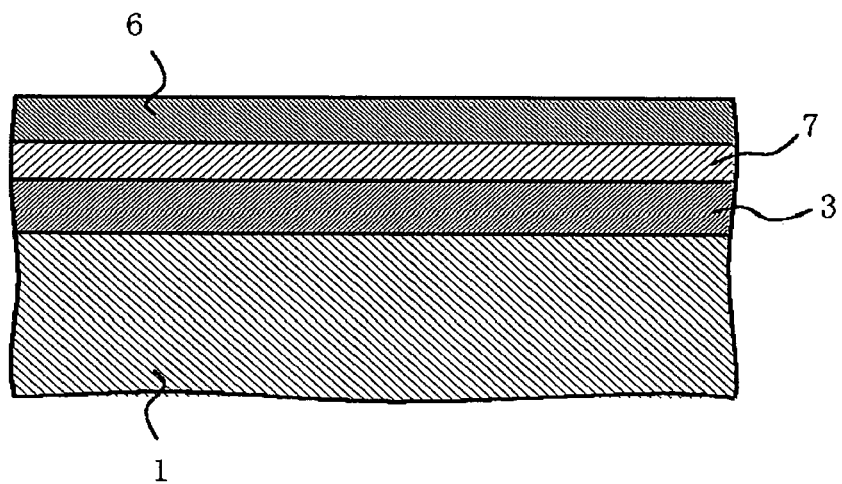
FIGS. 14A to 14B are partially enlarged, diagrammatic cross-sectional views showing a MOS field effect transistor according to an embodiment of the present invention and comparing it to another.

Specifically, in the above embodiments, as shown in FIG. 14A, a gate insulating film 3 is formed on a substrate 1 of silicon or the like, and further on the gate insulating film 3, a molecular solder layer (primary layer) 7 for improving the adhesion of the gate insulating film 3 to a channel layer 6 is formed.

Figure 14B:
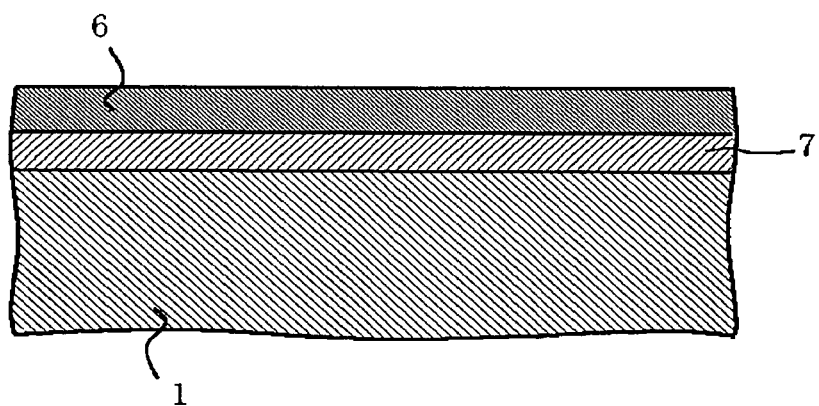

By contrast, in the present embodiment, as shown in FIG. 14B, on a substrate 1 of silicon or the like, a molecular solder layer (primary layer) 7 that includes a silane coupling agent is formed, and, on the molecular solder layer 7, a channel layer 6 is formed. Both sides of the molecular solder layer 7 are chemically bonded respectively to the substrate 1 and the channel layer 6. In other words, the silane coupling agent constituting the molecular solder layer 7 has, on the side of the channel layer 6, a functional group, such as an amino group or a thiol group, which may be reacted with the fine particles (e.g., gold), and, on the other hand, on the side of the substrate 1, it has an appropriate functional group for the material constituting the substrate 1 and the gate electrode (not shown).

Accordingly, formation of the gate insulating film, e.g., oxide film does not need a process requiring high cost and long time. Therefore, the construction of the whole transistor is simplified, thus reducing the number of steps in the fabrication process. In addition, the thickness of the whole transistor may be reduced, and further, the gate insulating film that includes the molecular solder layer 7 may be formed by a production process using a solution, making it possible to reduce the cost for the apparatus and the time needed for the production.

Specific examples of the silane coupling agents in an embodiment include N-2(aminoethyl)γ-aminopropylmethyldimethoxysilane, N-2(aminoethyl)γ-aminopropyltrimethoxysilane {AEAPTMS, structural formula (1) below}, N-2(aminoethyl)γ-aminopropyltriethoxysilane, 3-aminopropyltrimethoxysilane {APTMS, structural formula (2) below}, 3-aminopropylmethyldiethoxysilane {APMDES, structural formula (3) below}, 3-aminopropyltriethoxysilane, N-phenyl-3-aminopropyltrimethoxysilane, 3-mercaptopropyltrimethoxysilane {MPTMS, structural formula (4) below}, 3-mercaptopropylmethyldimethoxysilane {MPMDMS, structural formula (5) below}, mercaptomethyldimethylethoxysilane {MMDMES, structural formula (6) below}, mercaptomethylmethyldiethoxysilane {MMMDES, structural formula (7) below}, 3-cyanopropyldimethylmethoxysilane {CPDMMS, structural formula (8) below}, 3-cyanopropyltriethoxysilane {CPTES, structural formula (9) below}, 2-pyridylethyltrimethoxysilane {PETMS, structural formula (10) below}, and 2-(diphenylphosphino)ethyltriethoxysilane {DPPETES, structural formula (11) below}. In addition to the above well-known silane coupling agents, new materials may be synthesized according to the use by changing the length of an alkyl chain in the molecules.

Structural formula (1):

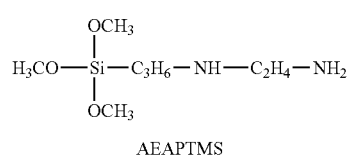

AEAPTMS

Structural formula (2):

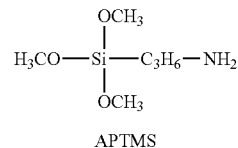

APTMS

Structural formula (3):

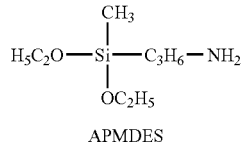

APMDES

-continued

Structural formula (4):

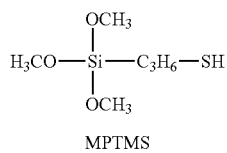

MPTMS

Structural formula (5):

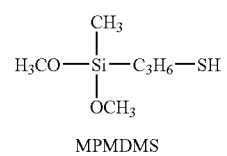

MPMDMS

Structural formula (6):

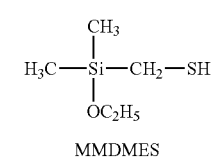

MMDMES

Structural formula (7):

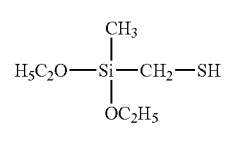

MMMDES

Structural formula (8):

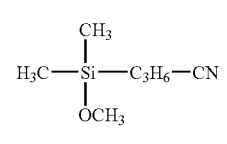

CPDMMS

Structural formula (9):

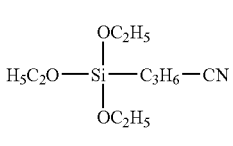

CPTES

Structural formula (10):

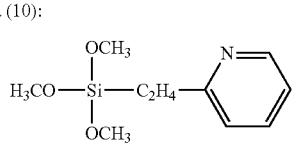

PETMS

Structural formula (11):

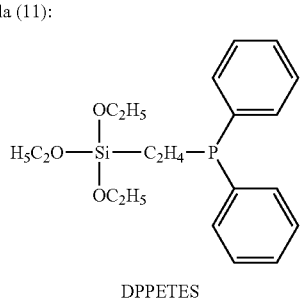

DPPETES

The above-listed general silane coupling agents are not all that may be used in the application in the present invention. The molecular solder layer may be capable of being chemically bonded to both the substrate having the gate electrode and the fine particles, and dithiol substances having thiol groups at both terminals may be used. As an example, decanedithiol (HS—$C_{10}H_{20}$—SH) can be used in an embodiment.

The basic structure of the silane coupling agent is a quasi-one-dimensional structure which may define the main chain, but there is no particular limitation, and two-dimensional or three-dimensional molecules may be used as long as the constituent portions to be bonded individually to the gate electrode (or the substrate) and the fine particles are surely bonded to them. In this case, the transistor properties formed by a network structure comprised of the fine particles should not suffer deterioration or damage.

Further, when using the primary layer as the gate insulating film, the silane coupling agent must be poor in electrical conductivity. Therefore, a silane coupling agent having an alkyl chain as a main chain may be used without any problem, but a silane coupling agent having a conjugated chain, which is considered to be excellent in conductivity, is difficult to be used in the application in the present invention.

Further, instead of the silane coupling agent, a nucleic acid (DNA) or the like may be used.

The construction of a "substrate-molecular solder layer (primary layer) that includes silane coupling agent-channel layer" in the present embodiment have been standard. For example, according to the report of the group in France in 2000 see, J. Collet, et al., Applied Physics Letters, vol. 76, pages 1339-1341 (2000), a monolayer of tetradecyl-1-enyl-trichlorosilane as a silane coupling agent is formed on a substrate, and a vinyl group at the upper end is oxidized into —COOH. On the monolayer film, another organic monolayer film (π conjugated system) which may be reacted with —COOH is formed. The silane coupling agent is of a non-conjugated system (σ system), and hence a system of substrate-σ system silane coupling agent monolayer film-π system monolayer film is formed. However, they did not prepare a transistor like in the present embodiment but merely examined the anisotropic conduction of the thin film having the above construction.

Further, in contrast to the above article, in the present invention, a portion of the channel layer in the transistor, in which carriers actually flow to drive the operation of the transistor, is comprised of the conjugated system molecules (organic semiconductor molecules) which bridge the gap between the fine particles. In the construction "substrate-molecular solder layer (primary layer)-channel layer" in the present embodiment, the silane coupling agent constituting the molecular solder layer is bonded to the (gold) particles in the channel layer and is not bonded to the semiconductor conjugated system molecules (organic semiconductor molecules) which bridge the gap between the fine particles.

Hereinbelow, how the bonding of the silane coupling agent to the fine particles (gold used here) may be strengthen is described in detail according to an embodiment.

Figure 15:
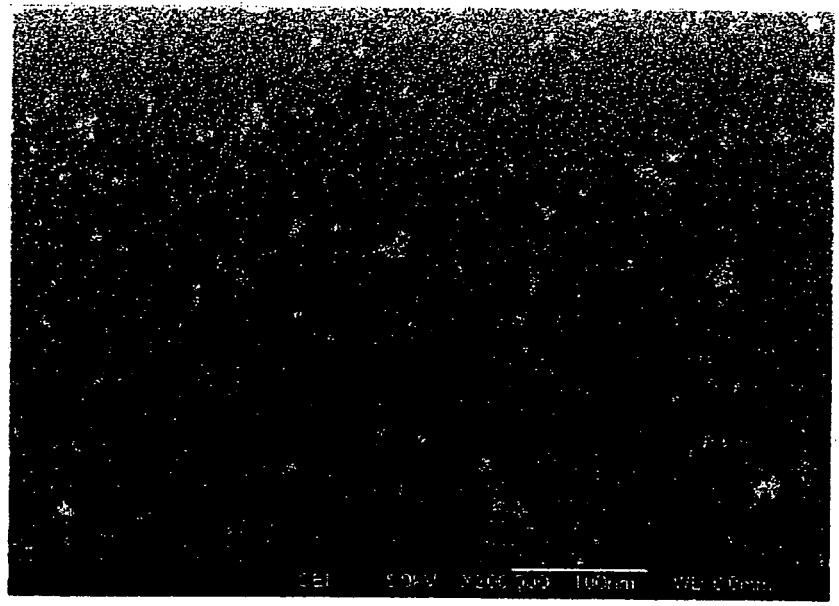
FIG. 15 illustrates a transmission electron microphotograph of a $SiO_2/Si$ substrate onto which gold fine particles are applied, followed by washing with toluene, in an embodiment 6 of the present invention.

FIG. 15 illustrates a transmission electron microphotograph of a $SiO_2$/Si substrate (Si substrate having a native oxide film $SiO_2$ formed on the surface), onto which gold fine particles are applied, followed by washing of the substrate surface with toluene. In FIG. 15, white dots indicate the gold fine particles, and the background indicates the $SiO_2$/Si substrate. In this case, the fine particles merely physically adsorb weakly on the substrate, and it is apparent that almost all the fine particles are removed after washing with toluene.

Figure 16:
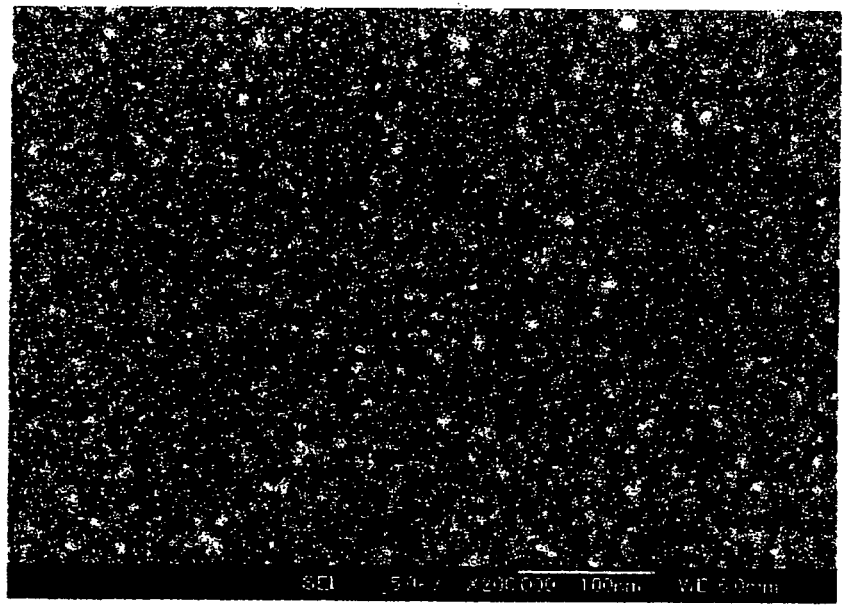
FIG. 16 illustrates a transmission electron microphotograph of a $SiO_2/Si$ substrate onto which gold fine particles are applied and further subjected to surface treatment with AEAPTMS, followed by washing with toluene, according to an embodiment of the present invention.

FIG. 16 illustrates a transmission electron microphotograph of a $SiO_2$/Si substrate (Si substrate having a native oxide film $SiO_2$ formed on the surface), onto which a thin film of AEAPTMS {N-2(aminoethyl)γ-aminopropyltrimethoxysilane} as a silane coupling agent is formed and further gold fine particles are applied to the thin film, followed by washing of the substrate surface with toluene. In FIG. 16, white dots indicate the gold fine particles, and the background indicates the $SiO_2$/Si substrate.

As is apparent from FIG. 16, when an AEAPTMS {N-2 (aminoethyl)γ-aminopropyltrimethoxysilane} thin film is formed as the primary layer and then gold fine particles are applied thereto, the fine particles are not removed even when being washed with toluene. In other words, the fine particles are immobilized onto the substrate by AEAPTMS.

Chemically describing, an alkoxy group (Si—OR, OR=methoxy group, ethoxy group) of AEAPTMS is first hydrolyzed into a silanol group and then undergoes a condensation reaction with a hydroxyl group on a substrate (in which the surface is preliminarily cleaned and hydroxyl groups cover the surface), and thus is chemically bonded to the substrate. AEAPTMS having a linear form has an amino group at a terminal on the opposite side of the substrate, and is bonded to the fine particles of gold or the like. Therefore, the substrate and the fine particles may be chemically bonded together through AEAPTMS, and the bonding is not broken simply by washing with toluene.

In the present embodiment, a layer that includes the silane coupling agent as such is used as a gate insulating layer, and hence a conventional gate insulating film that includes silicon oxide or the like is not required. Therefore, the whole transistor may be thinner. Further, the demand of use of an organic substance in more constituents of the organic transistor is met.

It is considered that the preparation of an organic transistor in which all the constituents that include an organic substance requires only a very low cost and a very short time. For example, according to the report of the laboratories of Philips in the Netherlands, they have succeeded in preparing all constituents of a transistor from an organic substance (polymer), e.g., not only the channel layer but also the electrodes and gate insulating film. See, articles of M. Matters, et al., Optical Materials, vol. 12, pages 189-197 (1997); and G. H. Gelinck, et al., Applied Physics Letters, vol. 77, pages 14871489 (2000). As examples of materials reported, polyimide and polyethylene terephthalate (PET) are used in the substrate, polyaniline is used in the electrode, and a photoresist, polyvinylphenol (PVP) and the like are used in the gate insulating film.

For arranging the fine particles orderly (namely, so as to be optimally close-packed) to create a two-dimensional network, the terminal functional groups of the silane coupling agent to be chemically bonded to the fine particles as a base themselves must be arranged orderly. For achieving this, it is necessary to form a monomolecular layer of the silane coupling agent. When the silane coupling agent is applied in a common manner, multiple layers are formed, and therefore it is preferred that molecules other than those in the chemically bonded lowermost layer are removed by rinsing in a solvent (e.g., hexane).

It is suggested that a monomolecular layer which is a very thin film in the nano order actually functions as a gate insulating film (for example, makes the leakage current satisfactorily small) as further supported by D. Vullaume, et al., Applied Physics Letters, vol. 69, pages 1646-1648 (1996)}. They have reported that the leakage current in the monomolecular layer of the silane coupling agent is smaller by 4 to 5 digits than that in silicon oxide having the same thickness. The organic thin films treated here have three types of thickness in 1.9 to 2.6 nm, and these have different lengths of alkyl chains. It is considered that the change of the length of the alkyl chain portion in the molecule may change the physical thickness of the transistor and the properties as the gate insulating layer.

From the above, it is considered that, when a layer that includes a silane coupling agent is used as the gate insulating film, not only be the fine particles constituting the channel layer chemically immobilized, but also the layer may exhibit satisfactory properties as the gate insulating film.

Substrate (Gate Electrode) (1)

When a thin film layer comprised of a silane coupling agent is used as the gate insulating film, the insulating film must be adjacent to the gate electrode, and therefore it is advantageous that the gate electrode serves also as a substrate. The most typical example actually used is a doped silicon substrate. It is noted that the silicon substrate generally has a very thin native oxide film on its surface without a separate process requiring time and cost. This is doped and hence in a low resistance state, and thus may be used as an (gate) electrode.

The substrate is dipped (generally dipped for about 20 minutes or longer) in a piranha solution (i.e., a mixture of sulfuric acid and an aqueous hydrogen peroxide solution (30%) in a 3:1 volume ratio) heated to a high temperature (e.g., about 60 to about 110° C.) to remove organic impurities deposited on the surface, simultaneously with formation of a hydroxyl group on the substrate surface. Not only this treatment with a piranha solution but also a treatment using an oxygen plasma asher apparatus exhibits the similar effect. For example, with respect to this substrate, a silane coupling agent having a general alkoxy group at a terminal is appropriate.

Substrate (Gate Electrode) (2)

As the gate electrode substrate, a gold plate (having any thickness) may be used. In this case, a thiol group is strongly chemically bonded to gold, and therefore, as a silane coupling agent which functions also as a gate insulating film, dithiol or the like is preferably used.

Gold Fine Particles

In the present embodiment, it is preferred that the fine particles have a particle size of about 10 nm or less as described above. It is known that fine particles having a size in the nano order may be relatively easily synthesized chemically. Nanoparticles as such are likely to undergo aggregation, and hence are not stable thermally. For this reason, the individual nanoparticles must be protected by linear organic molecules having a thiol group or an amino group at one terminal. Differing from the silane coupling agent, the linear organic molecules have at another terminal, for example, a methyl group. When the another terminal pointing the opposite direction of the fine particles of gold or the like is also a thiol group, the nanoparticles are considered to easily undergo aggregation.

Example 5

Another example of the fabrication method for fabricating a field effect transistor which is a semiconductor apparatus including the conducting path formed from the fine particles that includes a conductor or a semiconductor and the organic semiconductor molecules chemically bonded to the fine particles, wherein the electrical conductivity of the conducting path is controlled by an electric field, is described below pursuant to an embodiment.

1. Modification of Substrate Surface

The substrate surface is modified so that a silane coupling agent is easily bonded to the surface. For example, formation of a hydroxyl group on the substrate surface by a method in which the substrate is dipped in a piranha solution including sulfuric acid and aqueous hydrogen peroxide, or the substrate surface is irradiated with oxygen plasma or ozone is effective.

When a plastic substrate is used as the substrate instead of the silicon substrate having an insulating film formed thereon, it is preferred that the substrate surface is modified by oxygen plasma or ozone irradiation since the substrate surface is easily dissolved by acid of the piranha solution.

2. Bonding of Silane Coupling Agent to Substrate Surface

A silane coupling agent is deposited onto the above hydroxyl group-formed surface of the substrate to form a thin film that includes the silane coupling agent.

The silane coupling agent is a substance comprised of silicon (Si) and an organic substance, and generally has two types of functional groups having different reactivity, and one functional group has hydrolyzability like an alkoxy group (—OR(R is an alkyl chain)) and is easily reacted with an inorganic substance, and another functional group is easily reacted with an organic substance like a thiol group (—SH) or an amino group (—$NH_2$) and acts to bond an inorganic substance to an organic substance. The reactive group (—SiOR) in the silane coupling agent to be chemically bonded to the fine particles is hydrolyzed due to moisture into silanol (—SiOH), and partially undergoes a dehydration condensation reaction into an oligomer. In this case, the moisture may be moisture in air, or the silane coupling agent may be intentionally dissolved in water. The silanol group and the hydroxyl group on the substrate surface easily adsorb on one another through a hydrogen bond, enabling the silane coupling agent to be deposited on the substrate.

Specifically, the silane coupling agent may be deposited on the substrate surface by dipping the substrate in a solution prepared by diluting the silane coupling agent with an appropriate solvent. In addition, as a method other than the dipping, there is a method using vapor. For example, a silane coupling agent diluted solution or a silane coupling agent stock solution is placed in a closed container, and the substrate is disposed in the container, and the silane coupling agent may be deposited on the substrate surface using vapor of the silane coupling agent diluted solution or silane coupling agent stock solution.

Next, dehydration condensation for strengthening the bonding between the substrate surface and the surface of the thin film comprised of the silane coupling agent, and dehydration condensation for strengthening the bonding between the molecules in the thin film are conducted. In the dehydration condensation, a dehydration condensation reaction may be promoted by heating the substrate to a high temperature. See, Shin-Etsu Chemical Co., Ltd., "Silane Coupling Agent, 2 (2002)". This dehydration condensation reaction may be conducted after the below-described step of removing the excess silane coupling agent deposited onto the substrate surface, and the order thereof may be determined arbitrary.

The dehydration condensation may be advanced by, for example, heating the back of the substrate to about 100° C. or higher by a heating plate or the like.

After completion of the dehydration condensation reaction, a treatment of making uniform the thickness of the thin film comprised of the silane coupling agent on the substrate using an external force is conducted. The more uniform the thickness of the thin film, the more uniform the thickness of the channel layer prepared in the subsequent step, and it is considered that scattering of electrons passing through the channel layer is suppressed, and hence the value of a current which may flow the semiconductor apparatus may be increased, thus improving the properties.

Next, the excess silane coupling agent deposited on the substrate surface is removed. Here, the excess silane coupling agent deposited means the silane coupling agent which is bonded to the substrate surface by a van der Waals force not through a covalent bond or hydrogen bond, or which is placed on the substrate surface. As a removing method, for example, the substrate is dipped in hexane and subjected to ultrasonic cleaning to remove the molecules weakly bonded to the substrate, namely, the silane coupling agent which does not undergo dehydration condensation, and the like. The ultrasonic cleaning causes the weakly bonded molecules to be dissolved in hexane, so that they may be removed.

3. Bonding Between the Fine Particles and the Silane Coupling Agent

Next, the fine particles that include a conductor or a semiconductor are chemically bonded onto the thin film that include the silane coupling agent. The fine particles which are not chemically bonded to the thin film comprised of the silane coupling agent are removed. The fine particles are usually in a state such that they are dispersed in an appropriate solvent (colloid), and the solvent is dried and then the fine particles which are not chemically bonded to the silane coupling agent are removed by rinsing with a solvent prepared separately.

4. Bonding Between Organic Molecules and the Fine Particles

Subsequently, the fine particles bonded to the thin film that include the silane coupling agent are bonded to the organic semiconductor molecules having electrical conductivity to form a state such that the organic semiconductor molecules bridge the gap between the fine particles. The organic semiconductor molecules are bonded, and then the organic semiconductor molecules which are not chemically bonded to the fine particles are removed. When the organic semiconductor molecules are dissolved in a liquid and bonded, the excess organic semiconductor molecules may be removed by drying the solvent used.

Accordingly, there may be prepared a field effect transistor which is a semiconductor apparatus including the conducting path formed from the fine particles that includes a conductor or a semiconductor and the organic semiconductor molecules chemically bonded to the fine particles, wherein the electrical conductivity of the conducting path is controlled by an electric field.

Next, the present embodiments will be described in more detail with reference to the following specific examples, pursuant to various embodiments without limitation.

Example 6

First, as shown in FIGS. 3A to 3C, on a doped silicon substrate having a gate electrode formed thereon, silicon dioxide as a gate insulating film was prepared by a thermal oxidation method, and then titanium was placed on the gate insulating film, and electrodes corresponding to a source electrode and a drain electrode were prepared thereon from gold. The thus prepared substrate having the electrodes and gate insulating film formed thereon is hereinafter referred to as a "base body".

Hereinbelow, reference is made to FIGS. 17A to 17C and FIG. 18, and they are partially enlarged cross-sectional views for illustrating the surface state between the source-drain electrodes after the steps for forming the electrodes and gate oxide film on the substrate shown in FIGS. 3A to 3C.

Figure 17A:
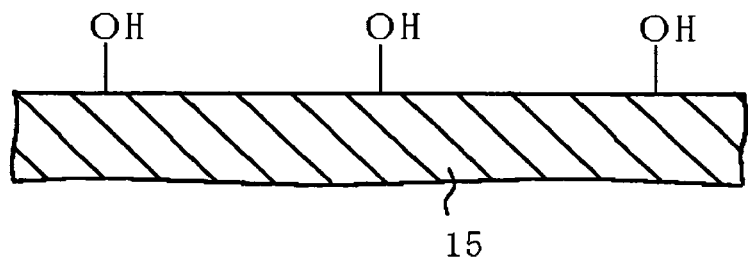
FIGS. 17A to 17C are partially enlarged, diagrammatic cross-sectional views showing an example of the steps in the fabrication of a MOS field effect transistor in an Example of the present invention pursuant to an embodiment.

Next, as shown in FIG. 17A, a hydroxyl group was formed on the surface of a base body 15 including the electrodes and gate oxide film formed on the substrate as described above so that the silane coupling agent was easily chemically bonded to the surface in the subsequent step. Specifically, a piranha solution which is a mixture of sulfuric acid and aqueous hydrogen peroxide having a concentration of 30% in a 3:1 volume ratio was prepared, and the piranha solution was heated to several tens ° C., such as about 60° C., and the base body 15 was dipped in the solution for several tens minutes, such as about 10 minutes. The base body 15 was taken out from the solution, and then the piranha solution remaining on the surface of the base body 15 was washed out with running high-purity water for several tens minutes, such as for about 20 minutes.

Instead of use of the piranha solution, the surface of the base body 15 may be irradiated with oxygen plasma to form a hydroxyl group on the surface of the base body 15. The oxygen plasma irradiation is conducted, for example, at a power of about 200 W under a pressure of about 133 MPa for about 3 minutes.

Next, an operation of dipping the base body 15 in ethanol (purity: 99.5% or higher, for use in high performance liquid chromatography; this applies to the following) was conducted once or several times, such as twice. Then, an operation of dipping the base body 15 in a 1:1 mixture of ethanol and hexane (purity: 96.0% or higher, for use in high performance liquid chromatography; this applies to the following) was conducted once or several times, such as twice. Then, an operation of dipping the base body 15 in hexane was conducted once or several times, such as twice. These steps are for facilitating formation of a layer that includes a silane coupling agent on the surface of the base body 15 in the following step. When the surface of the base body 15 is irradiated with oxygen plasma or ozone to form a hydroxyl group on the surface of the base body 15, the above operations of dipping the base body 15 individually in the ethanol, the 1:1 mixture of ethanol and hexane, and the hexane are not required.

Figure 17B:
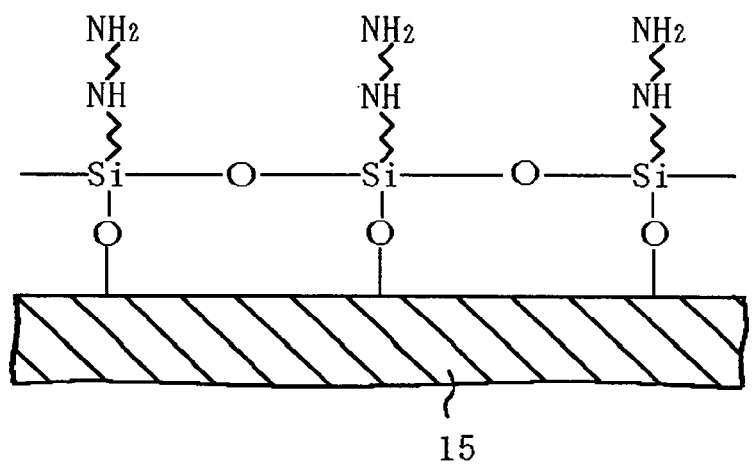

Next, the base body 15 was dipped in about 0.01 to about 10 by volume, such as 0.5% by volume, dilute solution of N-2 (aminoethyl)3-aminopropyltrimethoxysilane $\{(CH_3O)_3SiC_3H_6NHC_2H_4NH_2$, manufactured and sold by Shin-Etsu Chemical Co., Ltd.; hereinafter, referred to simply as "AEAPTMS"$\}$ as a silane coupling agent in hexane for several minutes to several tens minutes, such as for about 10 minutes. Accordingly, as shown in FIG. 17B, the silane coupling agent could be bonded to the surface of the base body 15. In FIG. 17B, alkyl chains are indicated simply by zigzag lines, and this applies to the following. Instead of this operation, the base body 15 may be allowed to stand in saturated vapor of AEAPTMS dilute hexane solution or stock solution for several tens minutes to several hours, such as for 30 minutes.

Next, the base body 15 was taken out from the AEAPTMS dilute hexane solution (or saturated vapor of the AEAPTMS dilute hexane solution or stock solution), and the base body 15 was dipped in hexane or high-purity water and subjected to ultrasonic cleaning for several minutes to several tens minutes, and then the base body 15 was heated to a temperature of about 100° C. to about 120° C. The ultrasonic treatment was conducted, for example, at a power of about 110 W to about 120 W at an oscillation frequency of 38 kHz for about 10 minutes.

By the cleaning by ultrasonic treatment, the excess AEAPTMS deposited on the surface of the base body 15, namely, AEAPTMS which is not chemically bonded to the hydroxyl group on the surface of the base body 15 may be removed. Further, by the drying treatment by heating the base body 15 to a temperature of about 100° C. or higher, a dehydration condensation reaction may be promoted in the AEAPTMS thin film and between AEAPTMS and the hydroxyl group on the surface of the base body to strengthen the chemical bonding. More specifically, the dehydration condensation reaction changes the hydrogen bond to a covalent bond, so that the bonding force becomes stronger.

Next, an operation of dipping the base body 15 in a hexane solution was conducted once or several times, such as twice. Then, an operation of dipping the base body 15 in a 1:1 mixture of hexane and toluene (purity: 99.7% or higher, for use in high performance liquid chromatography; this applies to the following) was conducted once or several times, such as twice. Then, an operation of dipping the base body 15 in a toluene solution was conducted once or several times, such as twice. These steps are for facilitating bonding of the gold fine particles to the silane coupling agent in the following step.

Figure 17C:
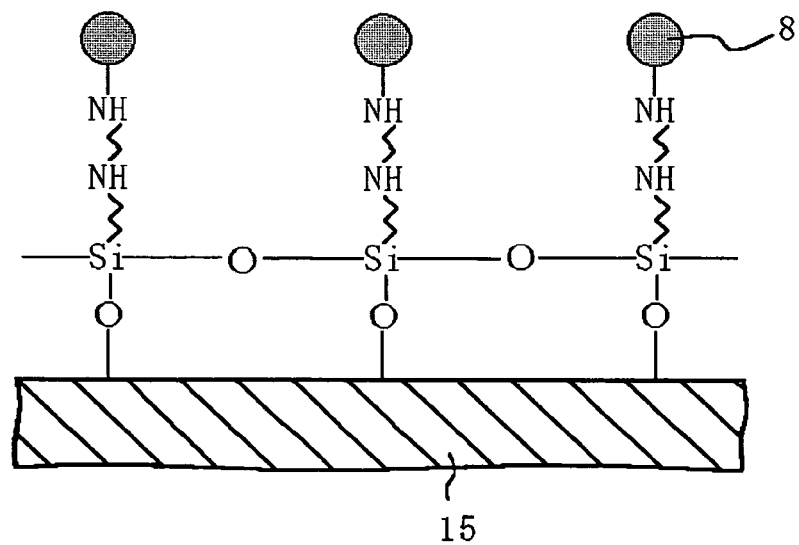

Next, about 100 ppm to about 1,000 ppm, such as about 1,000 ppm, solution of gold fine particles having a diameter of several nanometers in toluene was prepared, and the base body 15 was dipped in the gold fine particles-toluene solution for several hours, such as for about 1 hour. Accordingly, as shown in FIG. 17C, chemical bonding occurs between the gold fine particles 8 and the AEAPTMS thin film.

Next, the base body 15 was taken out from the gold fine particles-toluene solution, and an operation of roughly washing out with toluene the gold fine particles 8 which were not chemically bonded to the AEAPTMS thin film was conducted once or several times, such as twice.

Figure 18:
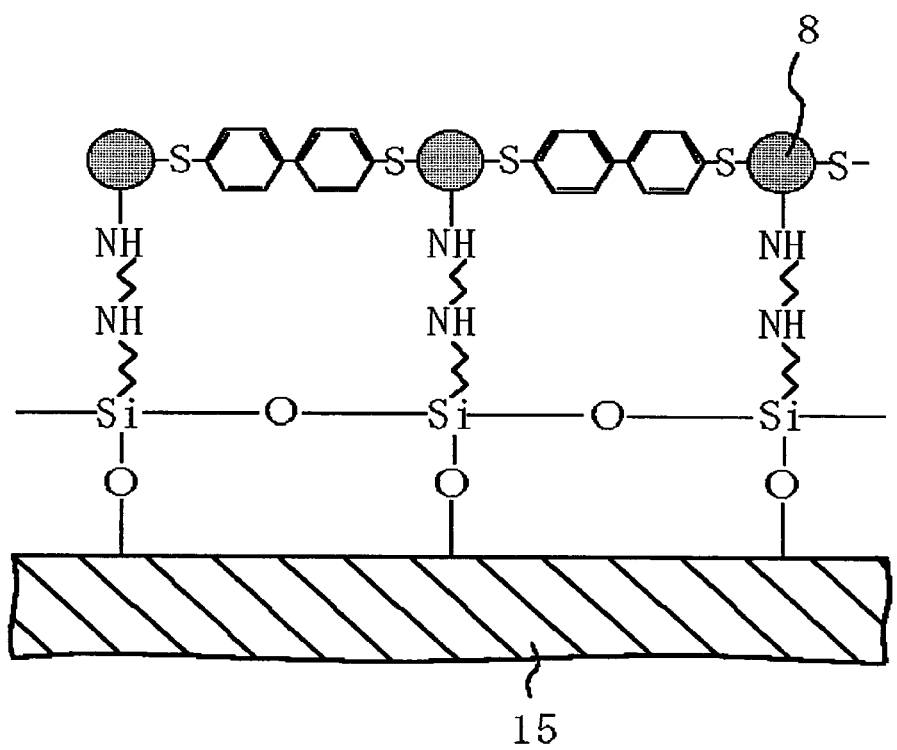
FIG. 18 is a partially enlarged, diagrammatic cross-sectional view showing one example of the step in the fabrication of the MOS field effect transistor in the Example pursuant to an embodiment.

Next, the base body 15 was dipped in an about 1 mM solution of 4,4'-biphenyldithiol ($HSC_6H_4C_6H_4SH$) as the organic semiconductor molecules in toluene for several hours to 1 day, such as for about 1 day. Accordingly, as shown in FIG. 18, the gold fine particles 8 are chemically bonded to 4,4'-biphenyldithiol.

Next, the base body 15 was taken out from the toluene solution of 4,4'-biphenyldithiol, and an operation of roughly washing out with toluene 4,4'-biphenyldithiol which was not chemically bonded to the gold fine particles 8 was conducted once or several times (e.g., twice). Then, the base body 15 was dried.

Accordingly, the MOS field effect transistor shown in FIGS. 1A to 1C could be prepared in which a channel region having the conducting path that includes the gold fine particles 8 and 4,4'-biphenyldithiol as the organic semiconductor molecules was formed, the source and drain electrodes were provided on both sides of the channel region, and the gate electrode was provided between the electrodes.

Figure 19:
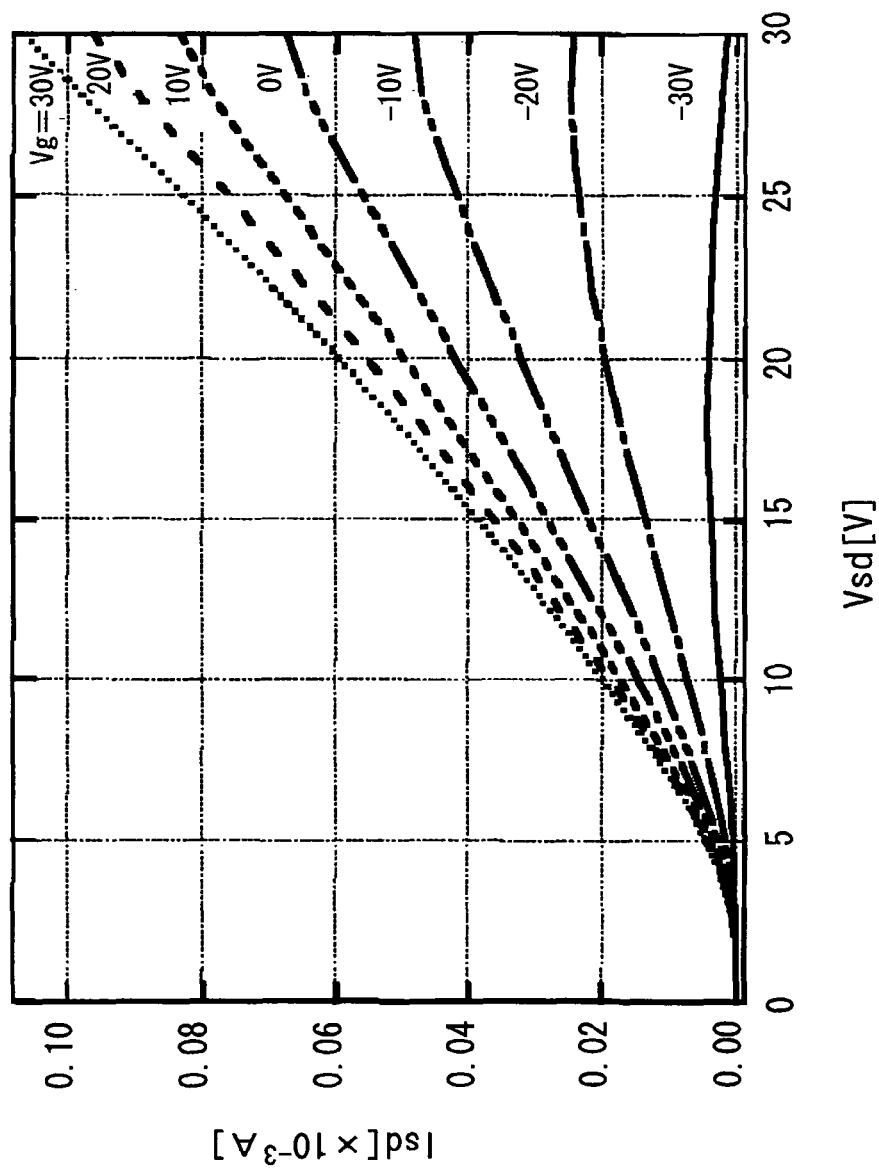
FIG. 19 is a current-voltage characteristics graph obtained by measuring a source-drain current ($I_{sd}$) against a source-drain voltage ($V_{sd}$) with respect to the field effect transistor in the Example pursuant to an embodiment.

With respect to this MOS field effect transistor, a current flowing between the source electrode and the drain electrode was measured against a voltage applied between the source electrode and the drain electrode while changing a voltage applied to the gate electrode. As a result, as shown in FIG. 19, the semiconductor operation could be confirmed. In the current-voltage characteristics graph of FIG. 19, figures shown at the right-hand end indicate voltage values applied to the individual gate electrodes measured.

Example 7

Figure 20:
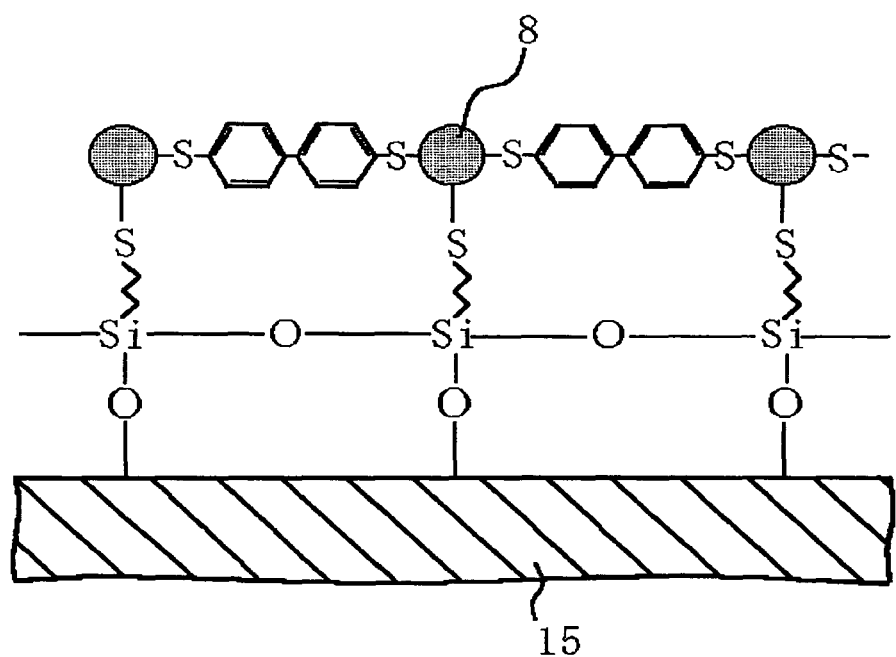
FIG. 20 is a partially enlarged, diagrammatic cross-sectional view showing another example of the step in the fabrication of the MOS field effect transistor in the Example pursuant to an embodiment.

A MOS field effect transistor was prepared in accordance with substantially the same procedure as in Example 1 except that, as a silane coupling agent, instead of AEAPTMS, 3-mercaptopropyltrimethoxysilane $\{(CH_3O)_3SiC_3H_6SH$, manufactured and sold by Shin-Etsu Chemical Co., Ltd.$\}$ was used (FIG. 20). With respect to the transistor prepared, current-voltage characteristics were measured in the same manner as that mentioned above. As a result, the semiconductor operation could be confirmed.

Hereinabove, the present invention is described with reference to the embodiments and examples, but the present invention is not limited to them, and may be changed or modified as long as the effect aimed at by the present invention may be obtained.

For example, as an example of the fine particles, the fine particles that include gold as the conductor are described, but fine particles that include silver or platinum, or cadmium sulfide, cadmium selenide, or silicon, and the like as the semiconductor may be used. The particle size is preferably about 10 nm or less in an embodiment.

On the other hand, as examples of the forms of the fine particles, sphere, rectangle, and nanorods are described, but the form in the present invention is not limited to them, and examples include triangle, cube, rectangular parallelopiped, cone, nanotube and the like pursuant to an embodiment.

In the present invention, fine particles are bonded by organic semiconductor molecules to form a conducting path, and hence there may be formed a conducting path in a network form in which the conducting path in the fine particles and the conducting path along the molecule skeleton in the organic semiconductor molecules are linked together according to an embodiment.

In an embodiment, a structure is obtained such that charge transfer occurs in the conducting path only in the direction of the axis of the molecule along the main chain of the organic semiconductor molecules. The conducting path includes no intermolecular electron transfer, and hence the mobility is not restricted by the intermolecular electron transfer which is the cause of low mobility of the conventional organic semiconductors.

Therefore, the charge transfer in the axis direction in the organic semiconductor molecules may be fully utilized. For example, when molecules having a conjugated system formed along the main chain are used as the organic semiconductor molecules, a high mobility due to delocalized π electrons may be utilized.

Further, the channel region constituting the conducting path may be formed layer by layer through a low-temperature process at about 200° C. or lower under atmospheric pressure. Therefore, a channel layer having a desired thickness may be easily formed, and a semiconductor apparatus may be fabricated on a flexible substrate, such as a plastic substrate, at a low cost.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor apparatus comprising:
   a conducting path that is formed from
      one or more organic semiconductor molecules, and
      one or more fine particles comprising any one of a conductor and a semiconductor,
   wherein the fine particles are three-dimensionally arranged and are bonded to one or more of the organic semiconductor molecules to form a three-dimensional network form, and
   wherein charge transfer in the conducting path is mainly intramolecular electron transfer.

2. The semiconductor apparatus according to claim 1, wherein the intramolecular electron transfer occurs in a conjugated system formed along a molecule skeleton formed from the organic semiconductor molecules.

3. The semiconductor apparatus according to claim 1, wherein the organic semiconductor molecules have at a terminal a functional group chemically bonded to the fine particles.

4. The semiconductor apparatus according to claim 3, wherein the organic semiconductor molecules and the fine particles are alternately bonded through the functional group at both terminals of the organic semiconductor molecules to form the conducting path in the network form.

5. The semiconductor apparatus according to claim 3, wherein the organic semiconductor molecules and the fine particles are three-dimensionally bonded together through the functional group.

6. The semiconductor apparatus according to claim 5, wherein the conducting path includes a conducting path in the fine particles and a conducting path in the organic semiconductor molecules.

7. The semiconductor apparatus according to claim 1, wherein the semiconductor apparatus is constructed as an insulated gate field effect transistor,
   wherein a channel region having the conducting path is formed, and
   wherein source and drain electrodes are provided on both sides of the channel region,
   a gate electrode is provided between the electrodes.

8. The semiconductor apparatus according to claim 1, wherein a bonded product of the fine particles and the organic semiconductor molecules forms a multi-layer structure that forms the conducting path.

9. The semiconductor apparatus according to claim 8, wherein a channel region is formed that includes the conducting path, and the bonded product forming the conductive path is a multi-layer structure that is formed independently layer by layer.

10. The semiconductor apparatus according to claim 9, wherein organic semiconductor molecules for a first one of the bonded product layers are of a different type that organic semiconductor molecules for a second one the bonded product layers.

11. The semiconductor apparatus according to claim 1, wherein the fine particles as the conductor include a conductor constituent selected from the group consisting of gold, silver, platinum, copper, aluminum, and combinations thereof, and wherein the fine particles as the semiconductor include a semiconductor constituent selected from the group consisting of cadmium sulfide, cadmium selenide, or silicon as the semiconductor.

12. The semiconductor apparatus according to claim 1, wherein the fine particles have a particle size of about 10 nm or less.

13. The semiconductor apparatus according to claim 12, wherein the fine particles include nanorods having a short diameter of about 10 nm or less and having an anisotropic form in an one-dimensional direction.

14. The semiconductor apparatus according to claim 13, wherein a distance between source and drain electrodes provided on both sides of a channel region with a gate electrode provided between the source and drain electrodes is smaller than a long diameter of the nanorods.

15. The semiconductor apparatus according to claim 1, wherein the organic semiconductor molecules are organic semiconductor molecules having a conjugated bond and having at both terminals of the molecule a functional group selected from the group consisting of a thiol group, an amino group, an isocyano group, a thioacetoxy group, and a carboxyl group.

16. The semiconductor apparatus according to claim 1,
wherein the semiconductor apparatus is constructed as an insulated gate field effect transistor;
wherein the field effect transistor is formed on a flexible substrate comprising an organic material;
wherein a channel region having the conducting path is formed; and
wherein source and drain electrodes are provided on both sides of the channel region, and a gate electrode is provided between the electrodes.

17. The semiconductor apparatus according to claim 1,
wherein a layer of the fine particles is formed on a primary layer that displays adhesion to the fine particles.

18. The semiconductor apparatus according to claim 17,
wherein the primary layer comprises a silanol derivative.

19. The semiconductor apparatus according to claim 18,
wherein the primary layer is used as a gate insulating film on a gate electrode.

20. The semiconductor apparatus according to claim 1, wherein electrical conductivity of said conducting path is controlled by an electric field.

21. The semiconductor apparatus according to claim 1, wherein in the conducting path, charge transfer mainly occurs in a direction of an axis of the organic semiconductor along a main chain of the organic semiconductor molecules.

* * * * *